(12) United States Patent
Otose

(10) Patent No.: US 9,454,945 B2
(45) Date of Patent: Sep. 27, 2016

(54) SCANNING CIRCUIT AND DISPLAY DEVICE

(71) Applicant: NLT TECHNOLOGIES, Ltd., Kanagawa (JP)

(72) Inventor: Tomohiko Otose, Kanagawa (JP)

(73) Assignee: NLT TECHNOLOGIES, LTD., Kanagawa (JP)

( * ) Notice: Subject to any disclaimer, the term of this patent is extended or adjusted under 35 U.S.C. 154(b) by 98 days.

(21) Appl. No.: 14/338,877

(22) Filed: Jul. 23, 2014

(65) Prior Publication Data

US 2015/0029174 A1    Jan. 29, 2015

(30) Foreign Application Priority Data

Jul. 24, 2013   (JP) ................................ 2013-153598

(51) Int. Cl.
| | |
|---|---|
| *G09G 5/18* | (2006.01) |
| *G11C 19/18* | (2006.01) |
| *G11C 19/28* | (2006.01) |
| *G09G 3/32* | (2016.01) |
| *G09G 3/36* | (2006.01) |

(52) U.S. Cl.
CPC ............. *G09G 5/18* (2013.01); *G09G 3/3266* (2013.01); *G09G 3/3674* (2013.01); *G09G 3/3677* (2013.01); *G11C 19/184* (2013.01); *G11C 19/28* (2013.01); *G09G 2310/0267* (2013.01); *G09G 2320/045* (2013.01); *G09G 2330/021* (2013.01)

(58) Field of Classification Search
CPC .... G09G 5/18; G09G 3/3266; G09G 3/3674; G09G 3/3677; G09G 2320/045; G09G 2330/021; G09G 2310/0267; G11C 19/28; G11C 19/187

See application file for complete search history.

(56) References Cited

U.S. PATENT DOCUMENTS

| | | | |
|---|---|---|---|
| 5,222,082 A | 6/1993 | Plus | |
| 2007/0247932 A1* | 10/2007 | Tobita | .................. G09G 3/3677 365/189.12 |
| 2008/0101529 A1* | 5/2008 | Tobita | .................. G09G 3/3677 377/64 |
| 2008/0316189 A1* | 12/2008 | Choi | ........................ G09G 3/20 345/204 |
| 2009/0273591 A1* | 11/2009 | Jinta | ..................... G09G 3/3258 345/211 |
| 2009/0303211 A1* | 12/2009 | Hu | ......................... G11C 19/28 345/204 |
| 2011/0018845 A1* | 1/2011 | Mizunaga | ............ G09G 3/3677 345/204 |
| 2012/0044133 A1* | 2/2012 | Nakamizo | .............. G11C 19/28 345/100 |
| 2013/0069930 A1* | 3/2013 | Fukaya | ................ G09G 3/3677 345/214 |
| 2013/0083885 A1* | 4/2013 | Lee | ........................ G11C 19/28 377/69 |

(Continued)

FOREIGN PATENT DOCUMENTS

| | | |
|---|---|---|
| JP | 8-87897 A | 4/1996 |
| JP | 2006-351171 A | 12/2006 |

*Primary Examiner* — Christopher E Leiby
(74) *Attorney, Agent, or Firm* — Sughrue Mion, PLLC

(57) ABSTRACT

A display device including a scanning circuit formed using single conductivity type thin-film transistors suppresses threshold changes in the thin-film transistors forming the scanning circuit by controlling a circuit for maintaining an internal node of the unit circuits forming the scanning circuit at a constant potential is controlled by a clock signal or a pulse signal having a smaller amplitude than the amplitude of an output signal.

21 Claims, 19 Drawing Sheets

(56) References Cited

U.S. PATENT DOCUMENTS

| | | | | |
|---|---|---|---|---|
| 2013/0170606 A1* | 7/2013 | Matsui | G11C 19/28 | 377/64 |
| 2014/0091997 A1* | 4/2014 | Han | G09G 3/3677 | 345/92 |
| 2014/0176410 A1* | 6/2014 | Ma | G09G 3/3622 | 345/92 |
| 2014/0177780 A1* | 6/2014 | Qi | G09G 3/20 | 377/64 |
| 2014/0240209 A1* | 8/2014 | Zhang | G09G 3/3648 | 345/92 |
| 2015/0077319 A1* | 3/2015 | Yao | G09G 3/20 | 345/100 |
| 2015/0302936 A1* | 10/2015 | Ma | G11C 19/28 | 377/64 |

\* cited by examiner

SCANNING CIRCUIT AND DISPLAY DEVICE

BACKGROUND

1. Technical Field

The present invention relates to a scanning circuit of a display device and, in particular, to a scanning circuit including single conductivity type thin-film transistors.

2. Related Art

Display devices using amorphous silicon thin-film transistors (hereinafter referred to as "a-Si TFTs) have been used in a variety of applications ranging from compact panels such as mobile phone monitors to large panels such as personal computer monitors and large-sized thin-screen televisions. In general, a-Si TFTs have been used only in pixel arrays forming display regions, whereas integrated circuits (ICs) with large scale integration (LSI) have been used in gate driving circuits for driving pixels.

Recently, techniques for forming pixel arrays and gate driving circuits have been actively developed to save display production cost and reduce frame length (a distance from an outer periphery of a display to a display region). In order to form a gate driving circuit using single conductivity type transistors such as a-Si TFTs, a dynamic unit circuit is generally used, such as those disclosed in Patent Literature below.

A unit circuit of Patent Literature 1 (U.S. Pat. No. 5,222,082: FIG. 2, from line 37 of page 6 of the description) will be described with reference to FIG. 10. In FIG. 10, the unit circuit of Patent Literature 1 is an example of a dynamic unit circuit including single conductivity type transistors. When INPUT is high level, both transistors 18 and 21 are turned ON and nodes P1 and P2, respectively, are set to (VDD–Vth) and VSS, respectively. Herein, Vth is a threshold voltage of the transistors 18 and 21. Due to the potential increase of the P1, a transistor 16 is turned ON. In addition, since the P2 is VSS, the transistors 17 and 19 are OFF. Then, when INPUT goes low, the node P1 goes into a floating state. In this state, when a clock signal C1 changes from low level to high level, the potential of an OUTPUT 1 increases. At that time, the potential of the floating P1 also increases due to a boot strap effect via a not-shown parasitic capacitor between nodes P1 to 13 (OUTPUT 1) of the transistor 16. Accordingly, since the potential of the node P1 increases to a potential not less than the high level, a high voltage signal is applied to the gate of the transistor 16, whereby a high level clock signal C1 is transferred to the OUTPUT 1 without attenuation. When a clock signal C3 goes high, a transistor 20 is turned ON and thus the node P2 is set to (VDD–Vth). Herein, Vth is a threshold voltage of the transistor 20. As a result, since the transistors 17 and 19 are turned ON, the node P1 and the OUTPUT 1, respectively, are set to VSS to prevent circuit malfunction.

In the structure of Patent Literature 1, when the OUTPUT 1 is at low level, the transistors 17 and 19 are always ON to pull down the node P1 or the OUTPUT 1 to VSS. In other words, a high level voltage is applied to gate terminals of the transistors 17 and 19, whereas a low level voltage is applied to source or drain terminals thereof. This bias state is hereinafter referred to as "plus gate stress". If the circuit is formed using a-Si TFTs, the "plus gate stress" causes a problem of increasing threshold voltage changes. In view of the problem of Patent Literature 1 above, the following solution has been disclosed.

A unit circuit of Patent Literature 2 (Japanese Unexamined Patent Application Publication No. H08-87897: FIG. 3 on page 6; from paragraph 0013) will be described with reference to FIG. 11. In FIG. 11, the unit circuit of Patent Literature 2 includes transistors 18, 25, 16, and 17 and a capacitor CB and is a dynamic unit circuit using ordinary single conductivity type transistors. When an input signal (a start signal or an $OUT_{n-1}$ as a preceding-stage OUT signal) is input to the transistor 18, the potential of a node P1 increases from VSS to (VDD–Vth) and is charged to the capacitor CB, thereby bringing the transistor 16 into a conductive state. When the input section goes low and, in turn, a high level voltage of a clock signal is input to a terminal C1, the node P1 is brought into a floating state. At this time, since the transistor 16 is in the conductive state, the potential of an OUTn also goes up from VSS. In other words, since the potential of one of electrodes of the capacitor CB increases, the potential of the other electrode (the node P1) thereof also increases due to a boot strap effect. As a result, a high voltage gate signal is applied to the transistor 16 and a high level clock signal is transferred from the C1 terminal to the OUTn. At that time, the transistor 17, which has received an external voltage Vc1, is ON. However, since the transistor 17 is adapted to exhibit a lower current-driving performance than the transistor 16, the signal OUTn is output without being attenuated. After completion of the output operation, the signal OUTn is pulled down to VSS by the transistor 17. In other words, the transistor 17 is under the "plus gate stress" during most of the period of time (the present structure has a problem in terms of power consumption since through-current flows at the output).

A unit circuit of Patent Literature 3 (Japanese Unexamined Patent Application Publication No. 2006-351171: FIG. 5 on page 18; from paragraph 0036) will be described with reference to FIG. 12. As with FIG. 11, the circuit is also a dynamic unit circuit using single conductivity type transistors. In the circuit structure, a transistor pair (T3 and T4) maintaining a node J1 at low level (Voff), a transistor (T8) maintaining a node J2 at low level, a transistor (T11) maintaining a node J3 at low level, and a transistor pair (T5 and T6) maintaining OUT at low level have gates controlled by a clock signal LCLK1 or LCLK2. In other words, the transistors are under "plus gate stress" at a duty of 50% and a voltage level of the LCLK1 (LCLK2) (the same level as an output signal).

SUMMARY OF THE INVENTION

However, even Patent Literature 2 and 3 described above cannot prevent circuit malfunction caused by threshold voltage changes when applied to a unit circuit using single conductivity type thin-film transistors.

The present inventor conducted an experiment to evaluate the characteristics of thin-film transistor at predetermined time intervals by applying a "plus gate stress" to the thin-film transistor under a high temperature condition and then found that the amount of threshold voltage changes increases with the passage of time and is dependent on gate voltage. FIG. 13 schematically depicts results (a to c) obtained using three gate voltages (Va>Vb>Vc). In the results, equivalent amounts of threshold voltage changes were observed even when driven at a 50% or 25% duty cycle.

Therefore, threshold voltage changes in a thin-film transistor increase in a state in which a certain external voltage Vc1 is applied to the gate thereof as the structure depicted in FIG. 11 or a high voltage clock signal of an output signal level is applied to the gate thereof as depicted in FIG. 12. When threshold changes increase, a current value obtained when a desired voltage is applied to the gate, source, and drain terminals of a thin-film transistor is different from a designed one, leading to a failure in which a desired operation cannot be obtained. In other words, scanning circuits using the conventional art cause circuit malfunction and cannot be applied to display devices.

It is an object of the present invention to provide a scanning circuit that suppresses changes in threshold voltage of transistors forming the circuit, and it is another object of the invention to provide a display device including the scanning circuit.

In order to solve the above problem, a scanning circuit according to a first aspect of the present invention includes a plurality of unit circuits, each of which includes a plurality of single conductivity type thin-film transistors and is controlled in synchronization with a plurality of clock signals, in which each of the unit circuits includes at least an output circuit, a reset circuit, and a reset signal generation circuit; the output circuit includes a circuit element for transferring one of the clock signals to an output terminal and a circuit element for maintaining the output terminal at a constant voltage; the reset circuit has a function of stopping the circuit element for transferring the clock signal to the output terminal; and the reset signal generation circuit generates a plurality of reset signals, the reset signals controlling the reset circuit and the circuit element for maintaining the output terminal at a constant voltage and having an amplitude smaller than an amplitude of the clock signals (FIGS. 4A and 5A).

A scanning circuit according to a second aspect of the present invention includes a plurality of unit circuits, each of which includes a plurality of single conductivity type thin-film transistors and is controlled in synchronization with a plurality of clock signals, in which each of the unit circuit includes at least an output circuit, a reset circuit, a reset signal generation circuit, and a reset cancellation circuit; the output circuit includes a circuit element for transferring one of the clock signals to an output terminal and a circuit element for maintaining the output terminal at a constant voltage; the reset circuit has a function of stopping the circuit element for transferring the clock signal to the output terminal; the reset signal generation circuit generates a plurality of reset signals, the reset signals controlling the reset circuit and the circuit element for maintaining the output terminal at a constant voltage and having an amplitude smaller than an amplitude of the clock signals; and the reset cancellation circuit has a function of stopping both the reset circuit and the circuit element for maintaining the output terminal at a constant voltage (FIG. 4A).

In the scanning circuit according to either one of the above aspects of the present invention, preferably, a potential change from a low level voltage to a high level voltage in the reset signals is performed by controlling the transistors in the reset signal generation circuit by the clock signals to turn ON; a potential change from the high level voltage to the low level voltage in the reset signals is performed by a plurality of capacitors in the reset signal generation circuit in accordance with a potential change from a high level voltage to a low level voltage in each of the clock signals; and the amplitude of the reset signals are smaller than the amplitude of the clock signals (FIG. 4A).

Preferably, in any one of the above scanning circuits of the invention, the amplitude of each of the reset signals is determined by the amplitude of each of the clock signals, a capacitor A electrically connected to the clock signal, and a capacitor B electrically connected to a terminal other than the clock signal. (FIG. 5A).

In addition, preferably, in each of the unit circuits included in the above scanning circuit, when the amplitude of the clock signal is V, a capacitance value of the capacitor A is Ca, and a capacitance value of the capacitor B is Cb, the amplitude of the reset signal is determined by the following formula: $Ca/(Ca+Cb) \times V$ (FIG. 5A).

Preferably, in any one of the above scanning circuits according to the invention, the clock signals and the reset signals, respectively, are of N phases (N is a natural number not less than 2) (FIG. 5C).

Furthermore, preferably, in any one of the scanning circuits according to the invention, the clock signals are of N phases (N is a natural number not less than 2); and the reset signal generation circuit includes at least N pieces of circuit elements, the N pieces of the circuit elements being controlled in synchronization with clock signals having mutually different phases (FIGS. 4D and 4E).

Additionally, preferably, in any one of the scanning circuits according to the invention, the clock signals are of N phases (N is a natural number not less than 2); and the reset signal generation circuit includes at least N pieces of circuit elements, the N pieces of the circuit elements including at least a switch and the capacitors A and B that are controlled by the clock signals (FIG. 4E).

In addition, preferably, when the amplitude of each of the clock signals is V, the capacitance value of the capacitor A is Ca, and the capacitance value of the capacitor B is Cb, the high level voltage of each of the reset signals is determined by the switch and the low level voltage of the reset signal is determined by reducing by an amount of a voltage substantially determined by the following formula (2): $Ca/(Ca+Cb) \times V$ from the high level voltage of the reset signal due to the change of the clock signal from the high level voltage to the low level voltage. (FIG. 7).

Preferably, in any one of the scanning circuits according to the invention, the clock signals are of N phases (N is a natural number not less than 2), and the reset signal generation circuit includes N pieces of circuit elements, the N pieces of the circuit elements including at least a clamp circuit for limiting the high level voltage of the reset signals to a voltage not more than the high level voltage of the clock signals and the capacitors A and B (FIG. 9).

Preferably, in the above scanning circuit according to the invention, when the amplitude of each of the clock signals is V, the capacitance value of the capacitor A is Ca, and the capacitance value of the capacitor B is Cb, the high level voltage of each of the reset signals is determined by the clamp circuit and the low level voltage of the reset signal is determined by reducing by an amount of a voltage substantially determined by the following formula: $Ca/(Ca+Cb) \times V$ from the high level voltage of the reset signal due to the change of the clock signal from the high level voltage to the low level voltage (FIG. 9).

Preferably, in any one of the scanning circuits according to the invention, the output circuit is electrically connected to the clock signals, a first node, and an output signal; the reset circuit is electrically connected to a low level power supply, the reset signals, the first node, and an output signal of an adjacent unit circuit or a control signal supplied from outside; and the reset signal generation circuit is electrically connected to the low level power supply, a reset power supply, the clock signals, and the reset signals (FIG. 4A).

Preferably, in any one of the scanning circuits according to the invention, the output circuit is electrically connected to one of the clock signals, a first node, and an output signal; the reset circuit is electrically connected to a low level power supply, the reset signals, the first node, and an output signal of an adjacent unit circuit or a control signal supplied from outside; the reset signal generation circuit is electrically connected to the low level power supply, a reset power supply, the clock signals, and the reset signals; and the reset cancellation circuit is electrically connected to the low level power supply, the first node, and one of the reset signals that has the same phase as the clock signal connected to the output circuit (FIG. 4A).

Preferably, in any one of the scanning circuits according to the invention, the clock signals are of N phases (N is a natural number not less than 2); the output signal includes a transfer transistor for transferring one of the clock signals, a first capacitor, and N pieces of reset transistors; the reset circuit includes at least two transistors; and the reset signal generation circuit includes at least N pieces of circuit elements, each of which includes at least one transistor, a second capacitor, and a third capacitor. (FIG. 4A).

Preferably, in the above scanning circuit of the invention, a gate, a drain, and a source, respectively, of the transfer transistor are electrically connected to a first node, the one of the clock signals, and an output signal, respectively, the first capacitor is electrically connected to the first node and the output signal, and respective gates, all sources, and all drains, respectively, of the reset transistors are electrically connected to any one of the reset signals, a low level power supply, and the output signal, respectively; a gate, a source, and a drain, respectively, of one of the two transistors of the reset circuit are electrically connected to one of the reset signals that has the same phase as the clock signal electrically connected to the drain of the transfer transistor of the output circuit, the low level power supply, and the first node, respectively; and a gate, a source, and a drain, respectively, the transistor of each of the circuit elements of the reset signal generation circuit are electrically connected to one of the clock signals, one of the reset signals, and a reset power supply, respectively; the second capacitor is electrically connected to the clock signal and the reset signal, and the third capacitor is electrically connected to the low level power supply or another electric wire and the reset signal (FIG. 4A).

Preferably, in the above scanning circuit of the invention, a gate, a drain, and a source, respectively, of the transfer transistor are electrically connected to a first node, the one of the clock signals, and an output signal, respectively, the first capacitor is electrically connected to the first node and the output signal, and respective gates, all sources, and all drains, respectively, of the reset transistors are electrically connected to any one of the reset signals, a low level power supply, and the output signal, respectively; a gate, a source, and a drain, respectively, of one of the two transistors of the reset circuit are electrically connected to one of the reset signals that has the same phase as the clock signal electrically connected to the drain of the transfer transistor of the output circuit, the low level power supply, and the first node, respectively; and a source, a drain, and a gate, respectively, of the transistor of each of the circuit elements of the reset signal generation circuit are electrically connected to the low level power supply, one of the reset signals, and the other one of the reset signals that is different from the reset signal connected to the drain, respectively, the second capacitor is electrically connected to one of the clock signals and the one of the reset signals, and the third capacitor is electrically connected to the low level power supply or another electric wire and the one of the reset signals. (FIG. 7).

Preferably, in the above scanning circuit of the invention, a gate, a drain, and a source, respectively, of the transfer transistor are electrically connected to a first node, the one of the clock signals, and an output signal, respectively, the first capacitor is electrically connected to the first node and the output signal, and respective gates, all sources, and all drains, respectively, of the reset transistors are electrically connected to any one of the reset signals, a low level power supply, and the output signal, respectively; a gate, a source, and a drain, respectively, of one of the two transistors of the reset circuit are electrically connected to one of the reset signals that has the same phase as the clock signal electrically connected to the drain of the transfer transistor of the output circuit, the low level power supply, and the first node, respectively; and a gate and a source of the transistor of each of the circuit elements of the reset signal generation circuit are electrically connected to one of the reset signals and a drain of the transistor of each thereof is electrically connected to a reset power supply, the second capacitor is electrically connected to one of the clock signals and the one of the reset signals, and the third capacitor is electrically connected to the low level power supply or another electric wire and the one of the reset signals. (FIG. 9).

In addition, in any one of the scanning circuits of the invention, preferably, the low level voltage of the reset signals is lower than the low level voltage of the clock signals (FIG. 5A).

Preferably, in any one of the scanning circuits according to the first and the second aspects of the invention, a first electrode of a capacitor C is connected to a gate of the transistor for determining the high level voltage of one of the reset signals and a second electrode of the capacitance C is connected to one of the clock signals (FIG. 14).

A display device according to the present invention includes any one of the scanning circuits according to the invention (FIGS. 1 and 2).

An advantageous effect of the present invention is to suppress threshold voltage changes in single conductivity type thin film transistors forming a scanning circuit.

The reason for that is that the invention allows a pulse signal with low amplitude to be supplied to the gates of the transistors forming a reset circuit in each of unit circuits that are elements of the scanning circuit.

DETAILED DESCRIPTION OF THE INVENTION

Hereinafter, a description will be given of a scanning circuit and a display device of each of embodiments according to the present invention with reference to the drawings.

First Embodiment

Description of Structure

A structure of a scanning circuit according to a first embodiment of the present invention will be described with reference to the drawings.

Figure 1:
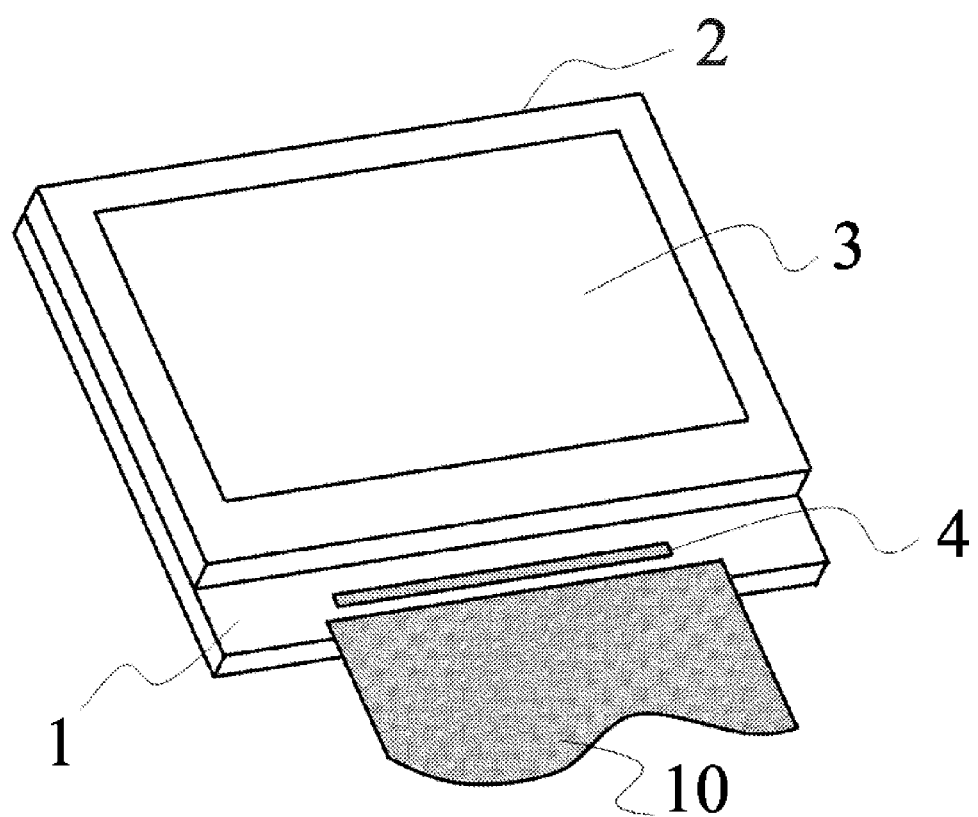
FIG. 1 is a perspective view depicting a structure of a display device according to a first embodiment of the present invention.
Figure 2:
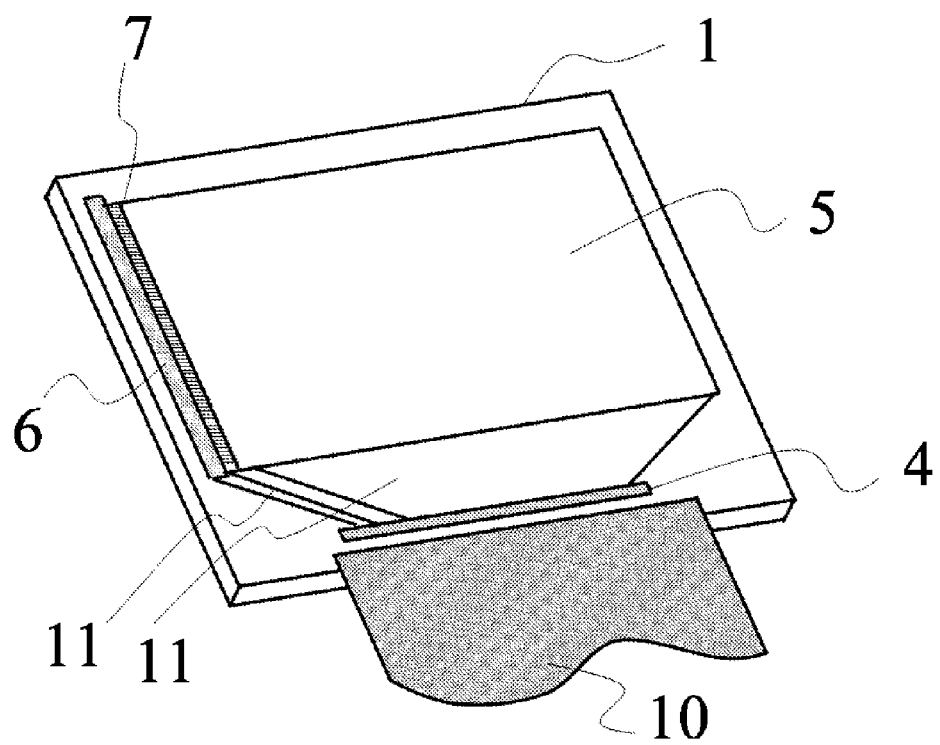
FIG. 2 is a perspective view depicting a structure of a first substrate of the first embodiment of the invention.
Figure 3A:
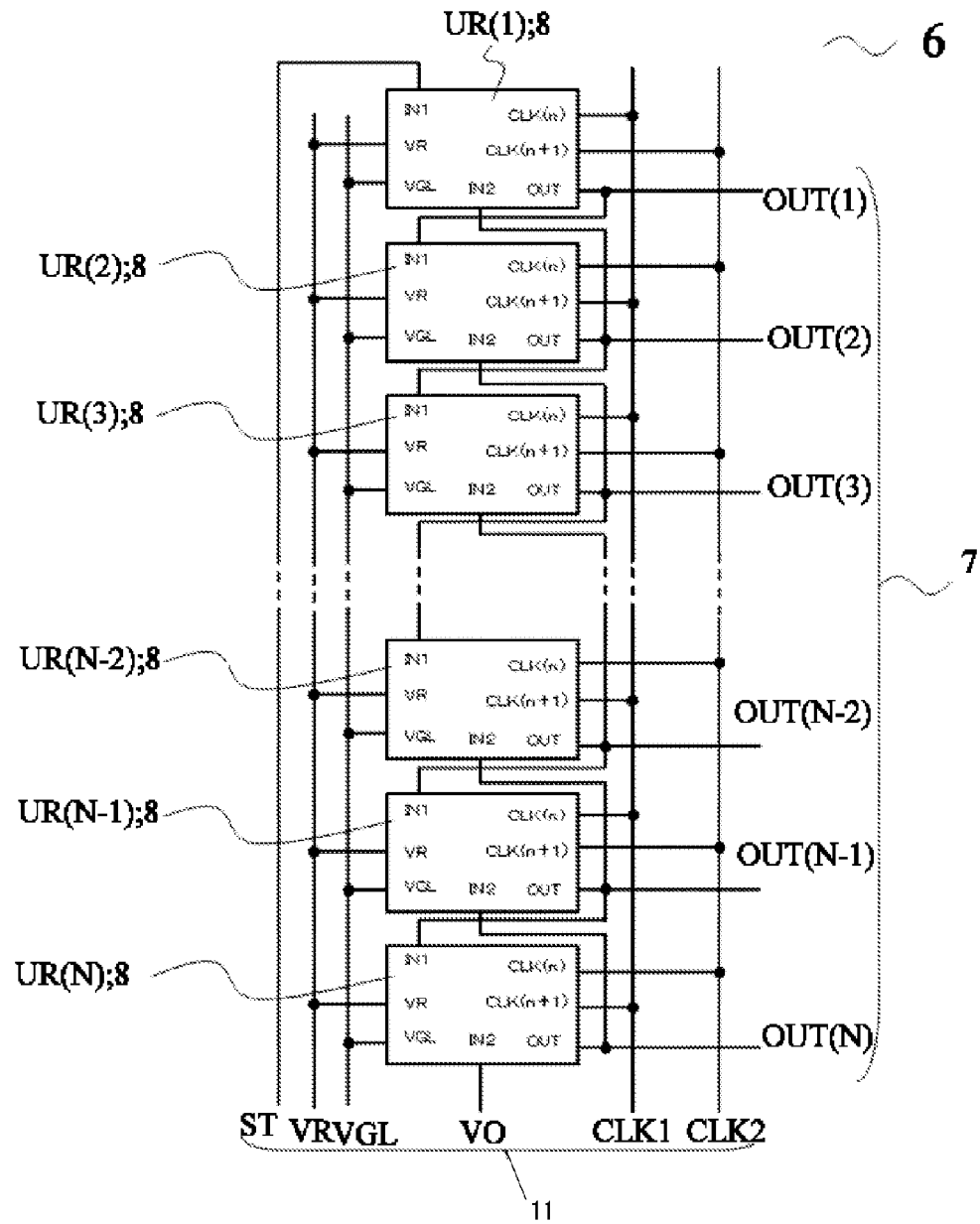
FIG. 3A is a block diagram depicting a structure of a scanning circuit according to a first embodiment of the invention.
Figure 3B:
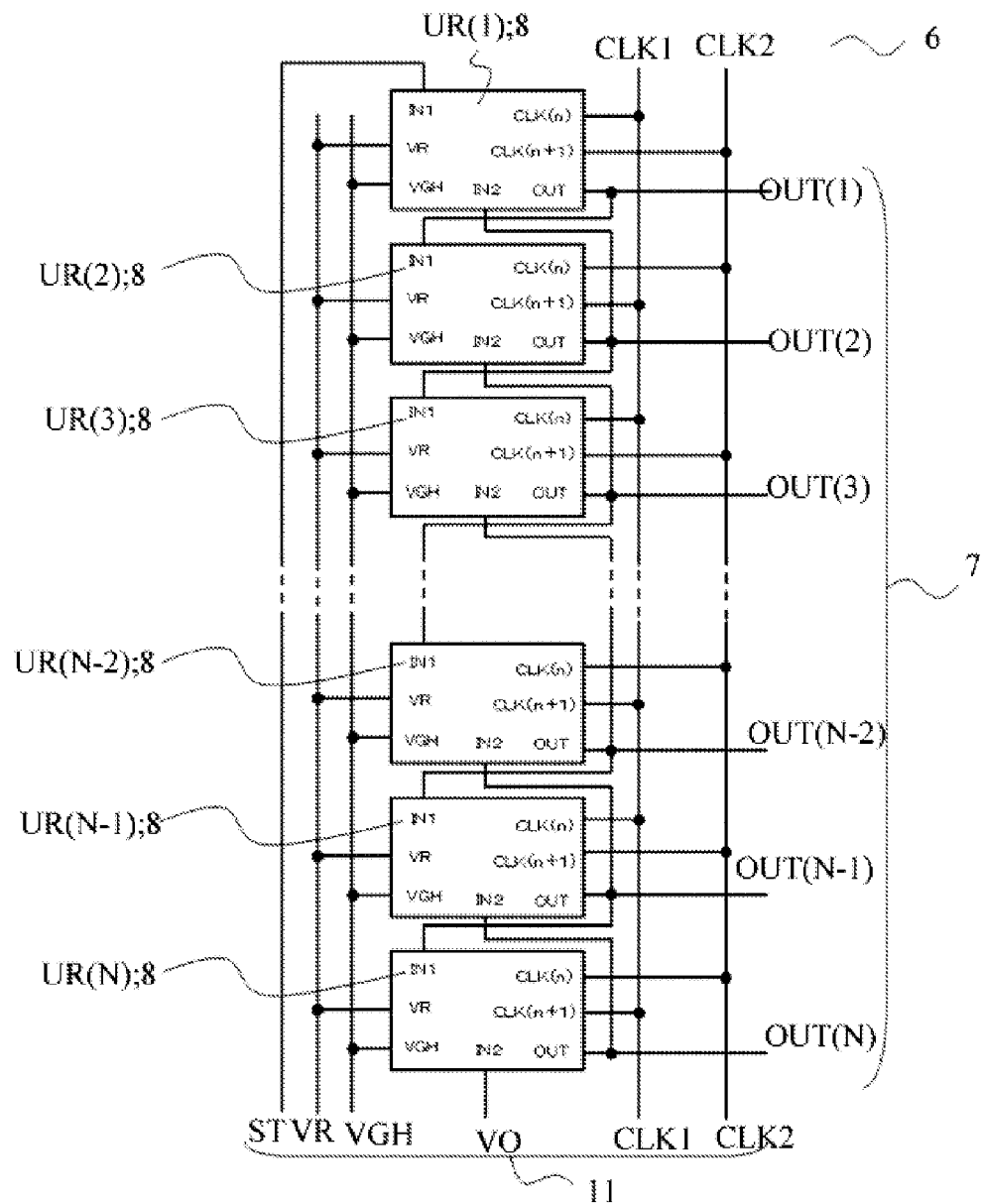
FIG. 3B is a block diagram depicting another structure of the scanning circuit according to the first embodiment of the invention.
Figure 3C:
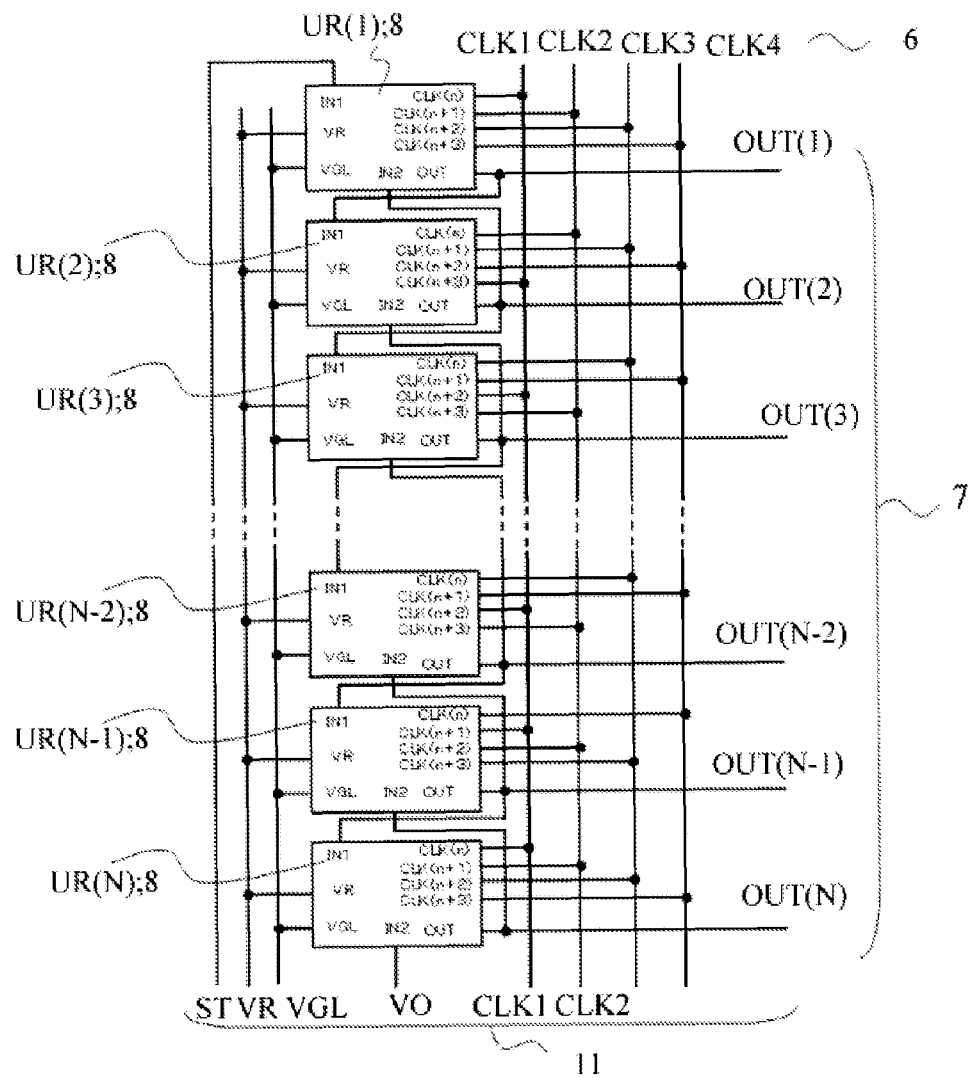
FIG. 3C is a block diagram depicting another structure of the scanning circuit according to the first embodiment of the invention.

FIG. 1 is a perspective view depicting a structure of a display device according to the first embodiment; FIG. 2 is a perspective view depicting a structure of a first substrate of the first embodiment; FIGS. 3A to 3C are block diagrams depicting structures of a scanning circuit according to the first embodiment; and FIGS. 4A to 4E are circuit diagrams depicting structures of a unit circuit of the first embodiment.

In FIG. 1, the display device of the first embodiment substantially includes a first substrate 1, a second substrate 2, a display section 3, a drive circuit 4, and a connection cable 10.

In FIG. 2, a structure of the first substrate 1 of the first embodiment substantially includes the drive circuit 4, a pixel array 5, a scanning circuit 6, scanning lines 7, and the connection cable 10. A signal output from a not-shown external connection device is input to the drive circuit 4 via the connection cable 10, and a signal output from the drive circuit 4 is supplied to the scanning circuit 6 or the pixel array 5 via a control signal line 11. A signal output from the scanning circuit 6 is output to the pixel array 5 via the scanning lines 7. The pixel array 5 receives a signal output from each of the drive circuit 4 and the scanning circuit 6 to control each pixel. The control allows the display section 3 of FIG. 1 to display a desired image.

FIGS. 3A to 3C depict three exemplary structures of the scanning circuit 6 of the first embodiment.

In FIG. 3A, there are arranged a plurality of unit circuits 8 (UR (1) to (3) . . . UR (N−2) to UR (N)) including single conductivity type thin-film transistors, and the respective unit circuits 8 are connected to respective scanning lines 7 (OUT (1) to OUT (N)). Herein, N is a natural number not less than 2 and is a value determined by the number of pixels in a longitudinal direction of the pixel array 5. When a control signal is input to the scanning circuit 6 via the control signal line 11, each of the unit circuits is controlled and an output signal is supplied to the scanning lines 7. The control signal line 11 input to the scanning circuit 6 includes a start signal ST, a reset voltage VR, a final-stage control signal VO, a low level power supply VGL, and two phases of clock signals CLK1 and CLK2. The unit circuit 8 has a plurality of terminals: IN1, IN2, VR, VGL, CLK(n), CLK(n+1), and OUT. The start signal ST is connected to IN1 of a first-stage unit circuit 8 (UR(1)). A terminal OUT of each preceding-stage unit circuit is connected to each of unit circuits 8 (UR(2), . . . ) of a second stage and thereafter. In addition, either the clock signal CLK1 or CLK2 is connected to the CLK(n) and CLK(n+1) for control. For example, the CLK1 and the CLK2, respectively, are connected to the CLK(n) and the CLK(n+1), respectively, of the UR(1), and the CLK2 and the CLK1, respectively, are connected to the CLK(n) and the CLK(n+1), respectively, of the UR(2). In the unit circuit UR(3) and thereafter, the connection relationship between the UR(1) and the UR(2) is repeated. The terminal OUT is connected to each of the scanning lines 7, as well as connected to each of IN2 of a preceding-stage unit circuit 8 and IN1 of a subsequent-stage unit circuit 8. The final-stage control signal VO is connected to an OUT(n+1) of the final-stage unit circuit UR (N).

As depicted in FIG. 3B, in another structure of the scanning circuit 6, among the terminals of the unit circuit 8, the low level power supply VGL has been changed to a high level power supply VGH. Due to this change, in the control signal line 11, the low level power supply VGL has been changed to the high level power supply VGH.

As depicted in FIG. 3C, in another structure of the scanning circuit 6, among the terminals of the unit circuit 8, the clock signal has been changed to four clock signals, CLK(n), CLK(n+1), CLK(n+2), and CLK(n+3). Due to this change, the control signal line 11 has been changed to include four clock signals CLK1 to CLK4.

Figure 4A:
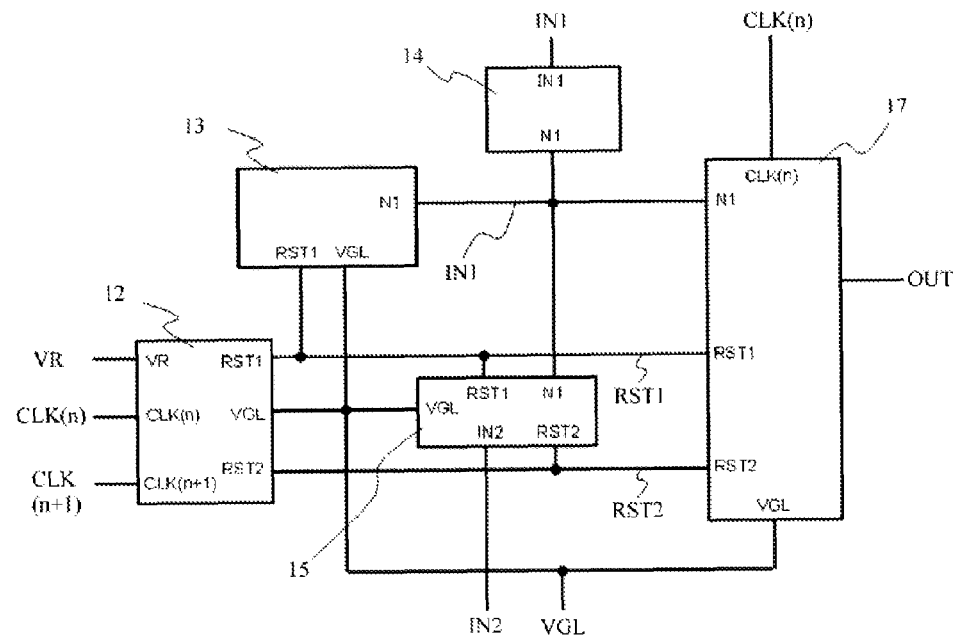
FIG. 4A is a block diagram depicting a structure of a unit circuit of the first embodiment of the invention.

FIG. 4A is a block diagram depicting a basic structure of the unit circuit 8 of the first embodiment. The unit circuit 8 of the first embodiment substantially includes a reset signal generation circuit 12, a reset cancellation circuit 13, an input circuit 14, a reset circuit 15, and an output circuit 17. The unit circuit 8 also includes, as terminals, input signals IN1 and IN2, clock signals CLK(n) and CLK(n+1), an output signal OUT, a reset voltage VR, and a low level voltage VGL, as well as includes N1, RST1, and RST2 as nodes for electrically connecting the respective circuits and the respective terminals described above.

The reset signal generation circuit 12 is controlled by the clock signal input terminal CLK(n) and the clock signal input terminal CLK(n+1) to control potentials of the RST1 and the RST2 to VR or VGL.

The reset cancellation circuit 13 is a circuit for setting the RST1 or the RST2 to VGL by a potential of the node N1.

The input circuit 14 is a circuit for receiving a signal from the terminal IN1 to control the node N1.

The reset circuit 15 is a circuit for receiving signals from the IN2, the RST1, and the RST2 to set the node N1 to VGL.

The output circuit 17 is a circuit for controlling the potential of the terminal OUT in accordance with the potentials of the nodes N1, RST1, and RST2.

As more specific examples of the unit circuit 8, FIGS. 4B to 4E depict structural examples of the unit circuit 8 of the first embodiment.

Figure 4B:
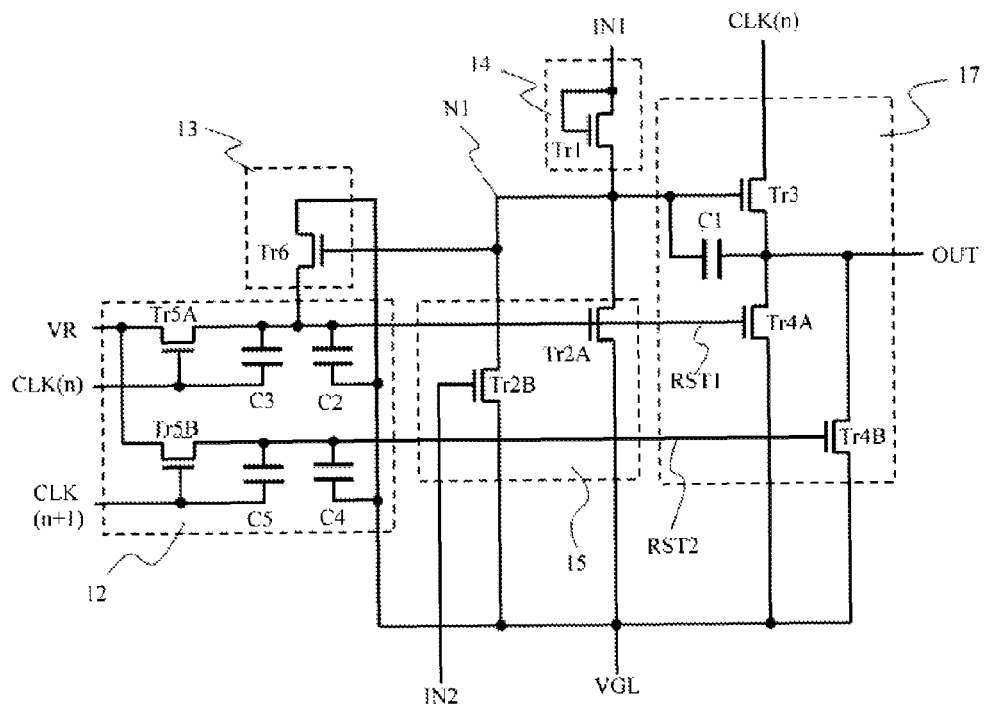
FIG. 4B is a circuit diagram depicting the structure of the unit circuit of the first embodiment of the invention.

In FIG. 4B, the unit circuit 8 of the first embodiment includes a plurality of NMOS transistors (Tr1 to Tr6), capacitors (C1 to C5), wires, and terminals, which are connected to each other as depicted in the drawing. In addition, the node N1 is connected to a gate terminal of the transistor Tr3 and a source or drain terminal of the transistor Tr1, source or drain terminals of the transistors Tr2A and Tr2B, a gate terminal of the transistor Tr6, and the capacitor C1, respectively.

The Tr1 has a gate controlled by a potential of the IN1 to have a function of increasing the potential of the node N1. Tr2A (Tr2B) has a gate controlled by a potential of the RST1 (RST2) to have a function of setting the node N1 to VGL. The Tr3 has a gate controlled by a potential of the node N1 to have a function of supplying a clock signal connected to the CLK(n) to the OUT or blocking the transfer of signals between the CLK(n) and the OUT. The Tr4A (Tr4B) has a gate controlled by a potential of the RST1(RST2) to have a function of setting the OUT to VGL, which is a function of keeping constant voltage of the OUT. The Tr5A (Tr5B) has a gate controlled by the CLK(n) (CLK(n+1)) to have a function of setting the RST1 (RST2) to VR. The Tr6 has a gate controlled by a potential of the node N1 to set the RST1 to VGL. One of terminals of each of the capacitors C2 and C3 is connected to the RST1 and the other terminal of each thereof is connected to VGL and CLK(n) to have a function of reducing the potential of the RST1 in accordance with a potential change in the CLK(n). One of terminals of each of the capacitors C4 and C5 is connected to the RST2 and the other terminal of each thereof is connected to either the low level voltage power supply VGL or the clock signal input terminal CLK(n+1) to reduce the potential of the RST2 in accordance with a potential change in the CLK(n+1).

Figure 4C:
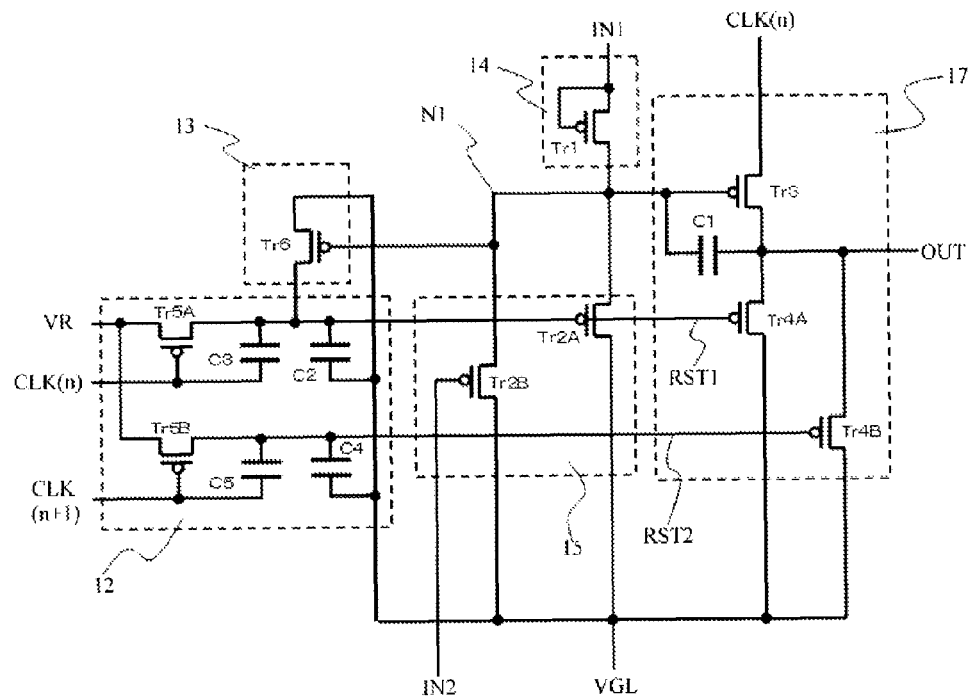
FIG. 4C is a circuit diagram depicting another structure of the unit circuit of the first embodiment of the invention.

In FIG. 4C, another structure of the unit circuit 8 of the first embodiment includes a plurality of PMOS transistors (Tr1 to Tr6), capacitors (C1 to C5), wires, the reset signal generation circuit 12, and terminals. Unlike the structure of FIG. 4B, the transistors are of PMOS type. Accordingly, a high level power supply VGH is provided instead of the low level power supply VGL.

Figure 4D:
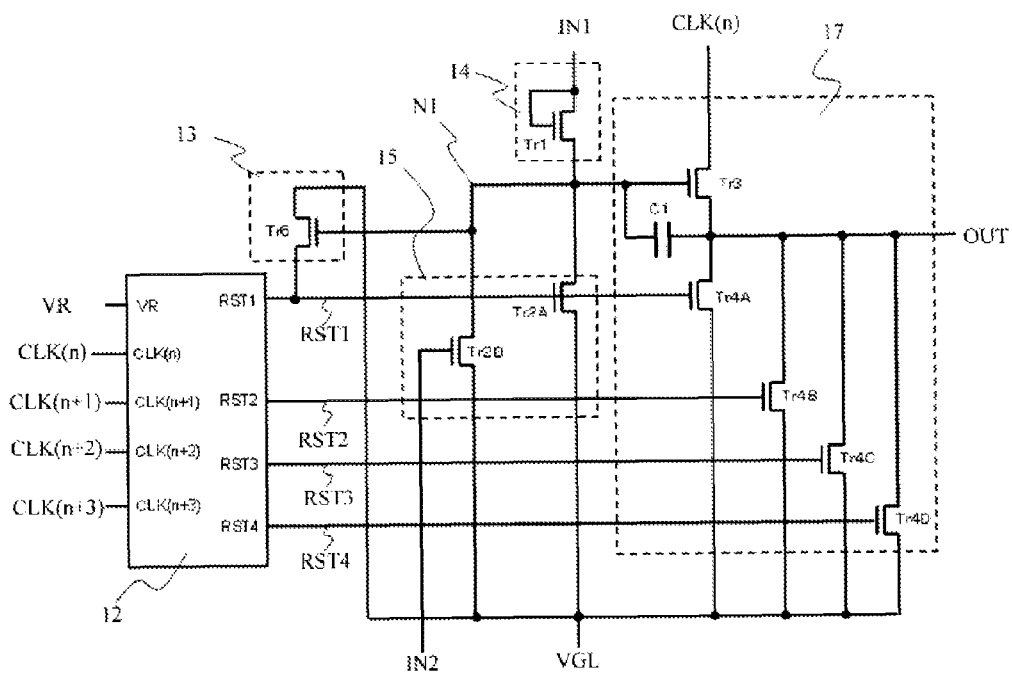
FIG. 4D is a circuit diagram depicting another structure of the unit circuit of the first embodiment of the invention.
Figure 4E:
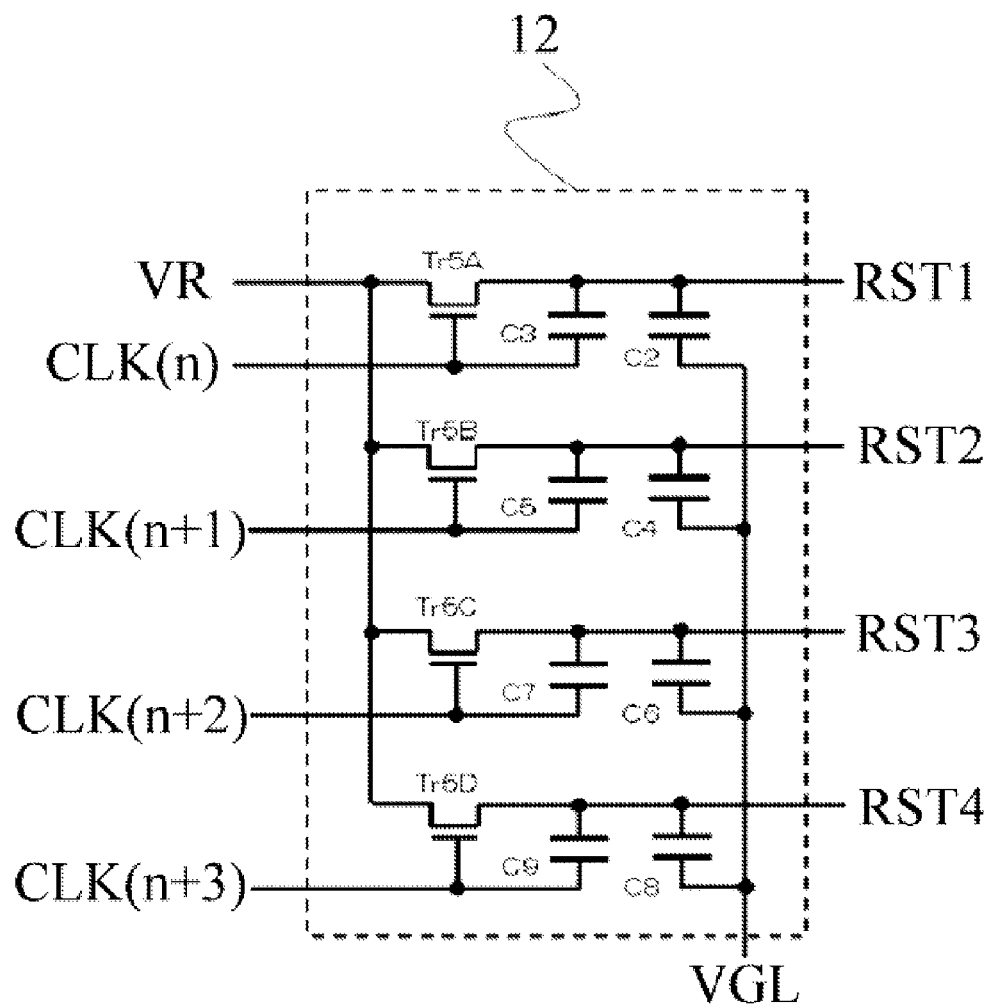
FIG. 4E is a circuit diagram depicting a structure of a reset signal generation circuit in the unit circuit of the first embodiment of the invention.

In FIGS. 4D and 4E, another structure of the unit circuit 8 of the first embodiment includes a plurality of NMOS transistors (Tr1 to Tr6), capacitors (C1 to C8), wires, the reset signal generation circuit 12, and terminals. This structure corresponds to four phases of clock signals, unlike the structures of FIGS. 4B and 4C. Accordingly, the number of transistors for setting the terminal OUT of the output circuit 17 to VGL has been increased to four (Tr4A to Tr4D). In addition, the numbers of the clock signal terminals and the nodes, respectively, have also been increased to provide CLK(n) to CLK(n+3) and RST1 to RST4, respectively.

Herein, the circuit structures, connections of the respective transistors and capacitors, and the like depicted in FIGS. 4A to 4E are an example of preferable modes and the invention is not limited thereto. In addition, physical shapes and sizes of the respective transistors and the respective capacitors are preferably designed so as to achieve an operation margin sufficient for a circuit operation in the section "Description of Operation" that will be described later.

Particularly preferably, a combination of the Tr5A and Tr6 is designed such that the Tr6 has a higher drive performance than the Tr5A, so that the RST1 can surely be set to VGL or the Tr2A and the Tr4A can surely be set to be OFF without depending on the operation state of the Tr5A when the Tr6 is ON.

In addition, preferably, capacitance values of the C2 to C5 are 10 times or more greater than a sum of the gate capacitances of the Tr2A and Tr4A (Tr4B) and the gate to source (or drain) capacitances of the Tr5A (Tr5B) and the Tr6. Furthermore, when the capacitance values thereof are 100 times or more greater than that, the RST1 or the RST2 can be more precisely controlled. Thus, in the scanning circuit driving a display device in the first embodiment, the unit circuit 8 as the element of the scanning circuit includes the plurality of transistors for maintaining the output signal OUT(n) to VGL and setting so as not to cause the signal to float (for example, the Tr4A and Tr4B of FIG. 4B).

As a gate signal supplied to these transistors, a low-amplitude pulse signal will be supplied by performing a circuit operation described in the section "Description of Operation" that will be described later, whereby the transistors are duty-driven at low-amplitude by reset signals. This allows the suppression of threshold voltage changes in the transistors, as compared to when driven at the same amplitude as that of a clock signal, so that there can be obtained a display device that includes the scanning circuit with improved reliability.

Description of Operation

An operation of the first embodiment will be described using FIGS. 3A, 4B, and 5A.

Figure 5A:
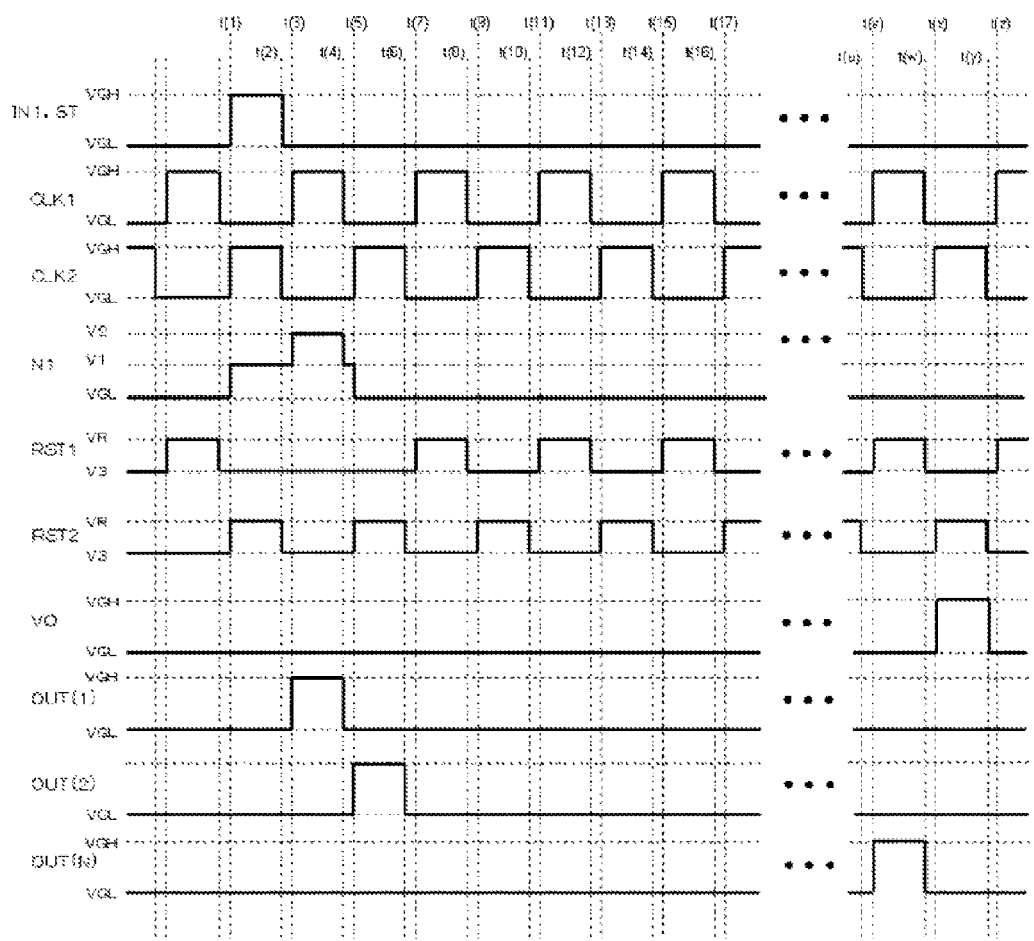
FIG. 5A is a timing chart illustrating an operation of the unit circuit of the first embodiment of the invention.
Figure 5B:
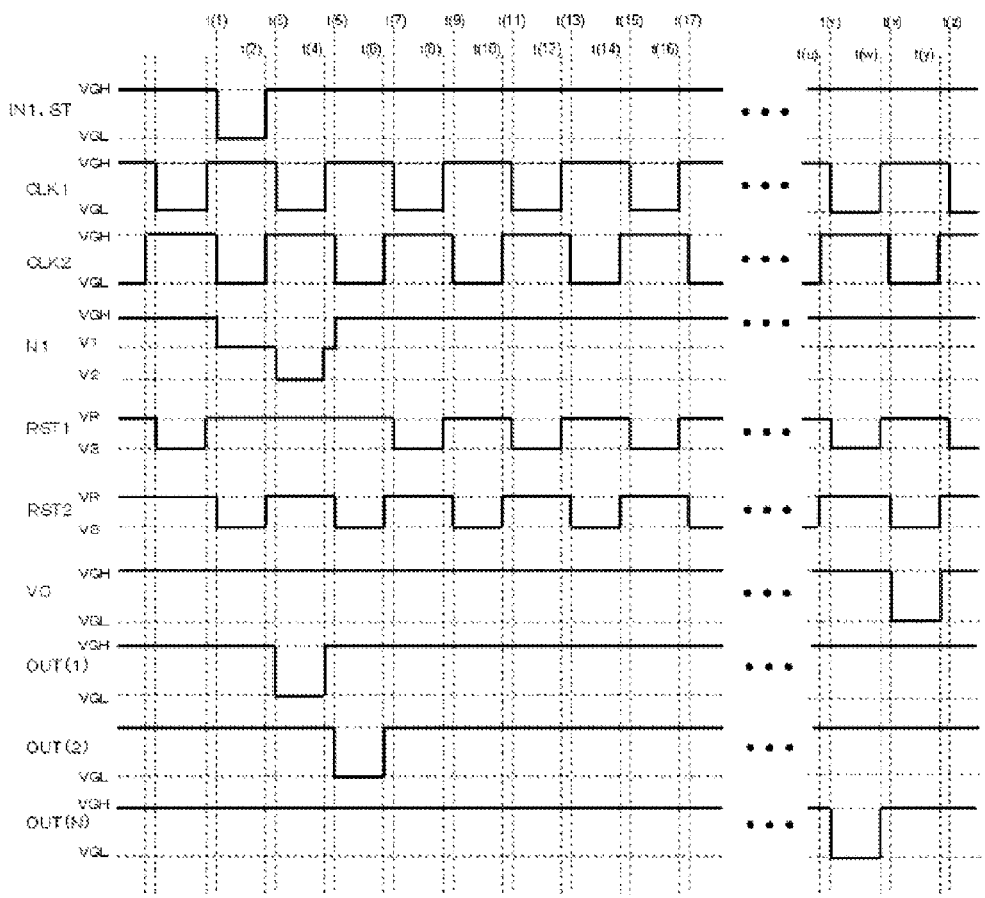
FIG. 5B is a timing chart illustrating an operation of the unit circuit of the first embodiment of the invention.

FIG. 5A depicts a timing chart of an operation of the structural example of the unit circuit 8 in the first embodiment depicted in FIG. 4B. The lateral axis represents time (t1) to (17), . . . t(u) to t(z)) and the vertical axis represents potentials of the respective signals, respectively. The input signal IN1 (ST to the first-stage unit circuit 8), the clock signals CLK1 to 2, the final-stage control signal VO, and the output signals OUT(1) to OUT(N) are signals with amplitudes from the high level voltage VGH to the low level voltage VGL. In addition, the reset signals RST1 to RST2 are signals with amplitudes from a reset voltage VR to an arbitrary voltage V3. Herein, the reset voltage VR is a voltage lower than the high level voltage VGH, and the V3 is a voltage not more than the low level voltage VGL. Additionally, these input signals do not have an on/off ratio of 50%. For example, in the case of CLK1, a time during which the signal is at the VGH level is from t(3) to t(4), and a time during which it is at the VGL level, namely the time of t(4) to t(7) is set to be longer.

A description will be given of the operation of the first-stage unit circuit 8 (UR(1)). In the UR(1), the CLK(n) and CLK(n+1), respectively, in FIG. 4B are connected to CLK1 and CLK2, respectively.

In a time t(1), potentials of the ST and the CLK2 change from VGL to VGH. As a result, since the transistor Tr1 is turned ON, the potential of the node N1 changes from VGL to V1 (=VGH−Vth). Herein, the Vth is a threshold voltage of the Tr1. Due to the increased potential of the node N1, the Tr3 is turned ON.

Next, in a time t(2), the potentials of the ST and the CLK2 change from VGH to VGL, whereby the Tr1 and Tr5B are turned OFF. Since the RST1 and the RST2 are at VGL level, the Tr2A and the Tr2B are OFF, thus causing the node N1 to be put into a floating state.

Next, in a time t(3), the CLK1 changes from VGL to VGH and therefore the signal passes through the Tr3 in the ON state, increasing the potential of the OUT(n). As a result, since the potential of the OUT as one of electrodes of the capacitor C1 has increased, the potential of the other electrode (the node N1) in the floating state furthermore increases from (VGH−Vth) to V2 due to a boot strap effect. Accordingly, since a large gate voltage not less than VGH is applied to the gate of the Tr3, the potential of the OUT changes to VGH without being attenuated. Additionally, since the Tr5A and the Tr6 are also ON, through-current flows from VR to VGL, whereby the RST1 is maintained at VGL and the voltage thereof does not change to VR. Since the RST1 is at VGL, the Tr2A and Tr4A are both maintained to be OFF.

Next, in a time t(4), the CLK1 changes from VGH to VGL. At that time, since the Tr3 is ON, the OUT changes from VGH to VGL, and the Tr5A and the Tr6 are turned OFF.

Next, in a time t(5), the CLK2 changes from VGL to VGH, whereby the Tr5B is turned ON and the RST2 changes to VR. Accordingly, the Tr4B is turned ON to maintain the OUT at VGL. Additionally, since the OUT of the subsequent stage UR(2) changes to VGH, the IN2 of the UR(1) also changes to VGH, whereby the TR2B is turned ON to set the node N1 to VGL. As a result, the Tr3 is turned OFF.

Next, in a time t(6), the CLK2 changes from VGH to VGL and thereby the Tr5B is turned OFF, causing the RST2 to be put in a floating state. In this state, the change of the CLK2 to VGL causes the redistribution of electric charges stored in the C4 and the C5, reducing the potential of the RST2 by V' from VR. Herein, the V' as a reset signal amplitude is represented by the following formula (1) using capacitance values of the C4 and the C5 and a clock signal amplitude (VGH−VGL).

$$V'=C5/(C4+C5)\times(VGH-VGL) \qquad (1)$$

Due to this operation, the RST2 changes from VR to V3 (=VR−V'). Thus, since the RST2 is connected to the gate of the Tr4B, the Tr4B is turned OFF.

Next, in a time t(7), since the CLK1 changes from VGL to VGH, the Tr5A is turned ON and thereby the RST1 changes to VR. As a result, both the Tr2A and the Tr4A are turned ON to maintain the node N1 and the OUT at VGL.

Next, in a time t(8), the CLK1 changes from VGH to VGL, thereby turning the Tr5A OFF. Since the Tr6A is OFF, the RST1 is in a floating state. In this state, the change of the CLK1 to VGL causes the redistribution of electrical changes stored in the C2 and the C3, reducing the potential of the RST1 by V' from VR. Herein, the V' is represented by the following formula (2) using capacitance values of the C2 and the C3 and a clock signal amplitude (VGH−VGL).

$$V'=C3/(C2+C3)\times(VGH-VGL) \qquad (2)$$

Due to the operation, the RST1 changes from VR to V3, thereby turning the Tr2A and Tr4A OFF.

Next, in a time t(9), the CLK2 changes from VGL to VGH, whereby the Tr5B is turned ON and the RST2 changes to VR. As a result, the Tr4B is turned ON to maintain the node N1 and the OUT at VGL.

In a time t(10) and times thereafter, the operations during a period of the times of from t(5) to t(10) are repeated. The main operation of the second-stage unit circuit 8 (UR(2)) is the same as that of the first-stage unit circuit 8 (UR(1)) except that the connection relationships of the CLK(n) and the CLK(n+1) are switched and the preceding-stage OUT signal is input to the IN1 in FIG. 4B, and the same also applies to operations of the third-stage unit circuit 8 (UR(3)) and thereafter. In a period of from times t(v) to t(w), the voltage of an output signal OUT(N) of a final-stage UR(N) becomes VGH, as a result of which all the scanning lines 7 are driven. In addition, the final-stage control signal VO is connected to the terminal OUT(n+1) in the final-stage UR(N) and thereby the voltage changes to VGH in a period of times t(x) to t(y). Accordingly, since VO is connected to the terminal 1N2 of the final-stage unit circuit UR(N);8, the Tr2B is turned ON to set the node N1 to VGL.

In the other structural example of the unit circuit 8 depicted in FIG. 4C, the NMOS transistors have been changed to the PMOS transistors, where the transistor polarity has been changed, although the basic operation of the unit circuit 8 is the same as that in FIG. 4B.

Figure 5C:
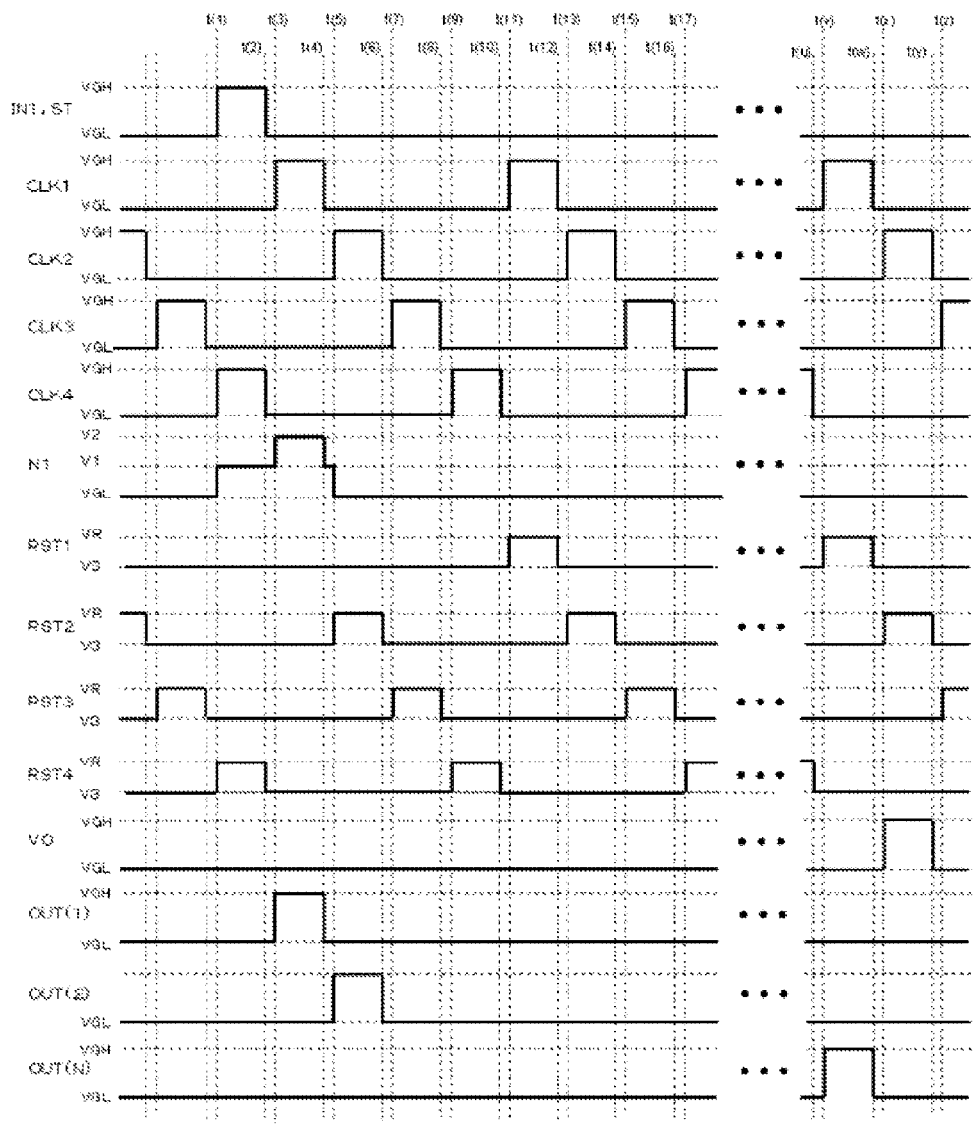
FIG. 5C is a timing chart illustrating an operation of the unit circuit of the first embodiment of the invention.

In addition, a description will be given of an operation of the unit circuit 8 corresponding to the four-phase clock depicted in 4D, with reference to FIG. 5C.

First, an operation of an initial-stage unit circuit 8 (UR(1)) will be described. In the UR(1), the CLK1, the CLK2, the CLK3, and CLK4, respectively, are connected to CLK(n), CLK(n+1), CLK(n+2), and CLK(n+3), respectively, in FIG. 4D.

In a time t(1), the potentials of the ST and the CLK4 change from the VGL to the VGH. As a result, since the transistor Tr1 is turned ON, the potential of the node N1 changes from VGL to V1 (=VGH−Vth). Herein, the Vth is a threshold voltage of the Tr1. Due to the increased potential of the node N1, the Tr3 is turned ON.

Next, in a time t(2), the potentials of the ST and the CLK4 change from VGH to VGL, whereby the Tr1 and Tr4D are turned OFF. Since the Tr2A and Tr2B are OFF, the node N1 is brought into a floating state.

Next, in a time t(3), the CLK1 changes from VGL to VGH and, increasing the potential of the OUT(n) passing through the Tr3 in the ON state. As a result, since the potential of the OUT as one of electrodes of the capacitor C1 has increased, the potential of the other electrode (the node N1) in the floating state furthermore increases from (VGH−Vth) to V2 due to a boot strap effect. Accordingly, since a large gate voltage not less than VGH is applied to the gate of the Tr3, the potential of the OUT changes to VGH without being attenuated. Additionally, since the Tr4A and the Tr6 are also ON, through-current flows from VR to VGL, whereby the RST1 is maintained at VGL and the voltage thereof does not change to VR. Since the RST1 is at VGL, the Tr2A and Tr4A are both maintained to be OFF.

Next, in a time t(4), the CLK1 changes from VGH to VGL. At that time, since the Tr3 is ON, the OUT changes from VGH to VGL, and the Tr4A and the Tr6 are turned OFF.

Next, in a time t(5), the CLK2 changes from VGL to VGH, whereby the Tr5B is turned ON and the RST2 changes to VR. Accordingly, since the Tr2B is turned ON, the node N1 changes to VGL and the Tr3 is turned OFF. In addition, the Tr4B is turned ON to maintain the OUT at VGL.

Next, in a time t(6), the CLK2 changes from VGH to VGL and thereby the Tr5B is turned OFF. In this state, due to the change of the CLK2 to VGL causes the redistribution of electric charges stored in the C4 and the C5, reducing the potential of the RST2 by V' from VR. Herein, the V' is represented by the formula (1) using capacitance values of the C4 and the C5 and a clock signal amplitude (VGH−VGL).

Due to this operation, the RST2 changes from VR to V3 (=VR−V'), whereby the Tr4B is turned OFF.

Next, in a time t(7), since the CLK3 changes from VGL to VGH and thereby the Tr5C is turned ON, the RST3 changes to VR. As a result, the Tr4C is turned ON to maintain the node N1 and the OUT at VGL.

Next, in a time t(8), the CLK3 changes from VGH to VGL, thereby turning the Tr5C OFF. Accordingly, the RST3 is brought into a floating state. In this state, the change of the CLK3 to VGL causes the redistribution of electrical changes stored in the C7 and the C8, reducing the potential of the RST3 by V' from VR. Herein, since the capacitance value of the C7 is substantially equal to that of the C2 and the capacitance value of the C8 is substantially equal to that of the C3, the V' is represented by the formula (2) using the capacitance values of the C2 and the C3 and the clock signal amplitude (VGH−VGL).

Due to this operation, the RST3 changes from VR to V3, thereby turning the Tr4D OFF.

Next, in a time t(9), the CLK4 changes from VGL to VGH, whereby the Tr5D is turned ON and the RST4 changes to VR. As a result, the Tr4D is turned ON to maintain the OUT at VGL.

Next, in a time t(10), the CLK4 changes from VGH to VGL, thereby turning the Tr5D OFF, and thus the RST4 is brought into a floating state. In this state, the change of the CLK4 to VGL causes the redistribution of electric charges stored in the C8 and the C9, reducing the potential of the RST4 by V' from VR. Herein, since the capacitance value of the C8 is substantially equal to that of the C2 and the capacitance value of the C9 is substantially equal to that of the C3, the V' is represented by the formula (2) using the capacitance values of the C2 and the C3 and the clock signal amplitude (VGH−VGL).

Due to this operation, the RST4 changes from VR to V3, thereby turning the Tr4D OFF.

In a time t(11) and times thereafter, the operations during the times from t(5) to t(10) are repeated.

The main operation of the second-stage unit circuit 8 (UR(2)) is the same as that of the first-stage unit circuit 8 (UR(1)) except that since the connection relationships of the CLK(n) to CLK(n+3) in FIG. 4D are shifted, the CLK2, the CLK3, the CLK4, and the CLK1, respectively, are connected to the terminals CLK(n), CLK(n+1), CLK(n+2), and CLK(n+3), respectively, and a preceding-stage OUT signal is input to the IN1. The same also applies to a third-stage unit circuit 8 (UR(3)) and thereafter. In times t(v) to t(w), the voltage of an output signal OUT(N) of a final-stage UR(N) becomes VGH, resulting in driving all the scanning lines 7. In addition, the final-stage control signal VO is connected to the terminal OUT(n+1) in the final-stage UR(N) and thereby the voltage changes to VGH in a period of times t(x) to t(y). Accordingly, the Tr2B is turned ON to set the node N1 to VGL.

As described above, in the scanning circuit driving the display device in the first embodiment, a low voltage amplitude pulse signal is applied to the gates of the transistors (for example, the Tr4A and Tr4B in FIG. 4B) for setting such that the OUT(n) (the scanning line 7) is not brought into a floating state and the transistor (for example, the Tr2A in FIG. 4B) for driving the node N1. Thus, threshold voltage changes in the transistors are reduced as compared to when driven with the same level of amplitude as the amplitude of the clock signal, so that there can be obtained a display device in which reliability of the scanning circuit has been improved. Moreover, by making the low level voltage of the reset signal lower than VGL supplied to the OUT(n), the threshold voltage changes are expected to be further suppressed. Therefore, there can be obtained a display device including the more reliable scanning circuit.

Second Embodiment

Description of Structure

A structure of a scanning circuit according to a second embodiment of the present invention will be described with reference to the drawings. In the second embodiment, the structures of the scanning circuit and the unit circuit are different from those in the first embodiment. However, the structure of the display device depicted in FIG. 1 and the structure of the first substrate depicted in FIG. 2 are also applied to the second embodiment.

Figure 6:
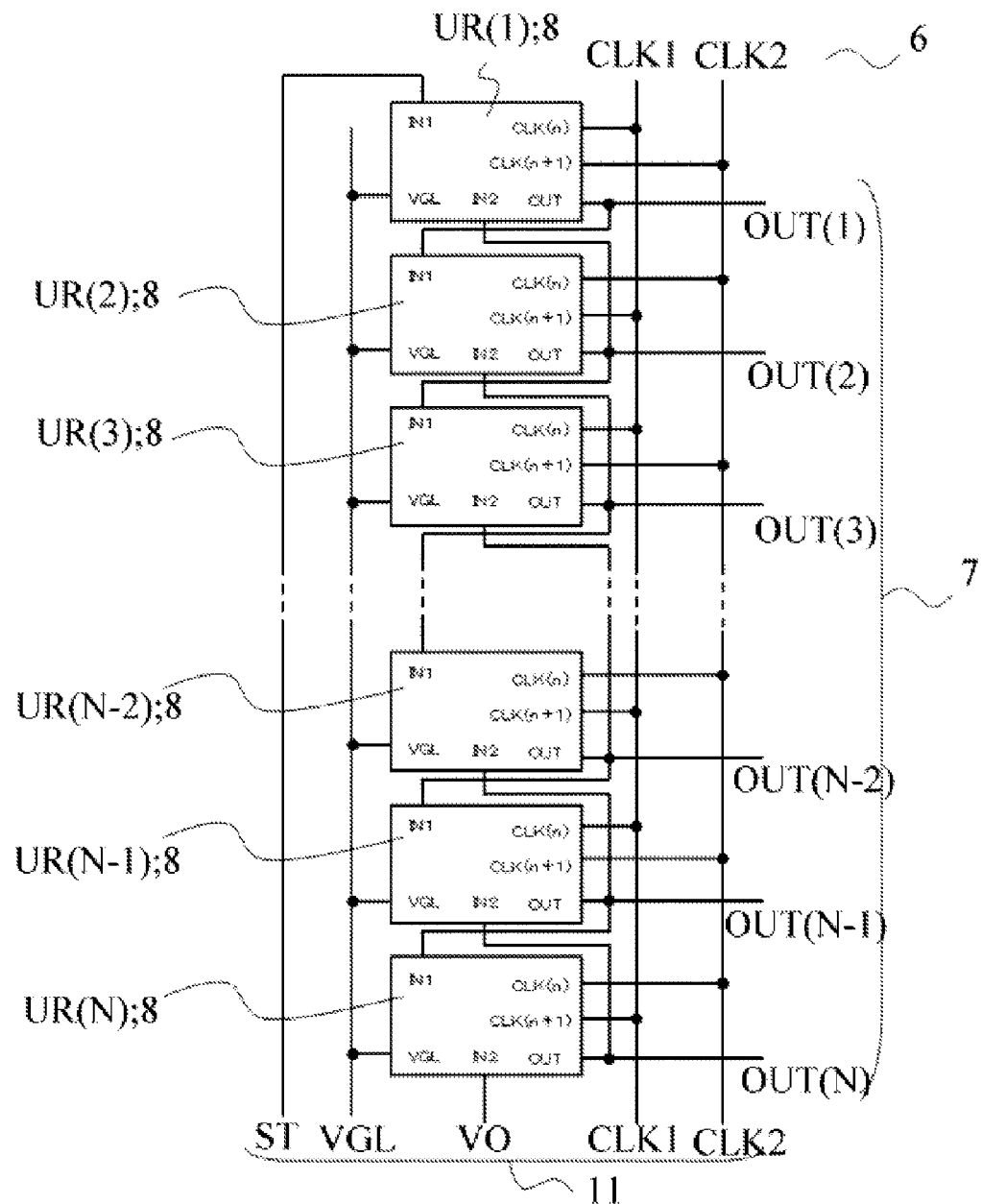
FIG. 6 is a block diagram depicting a structure of a scanning circuit according to a second embodiment of the invention.
Figure 7:
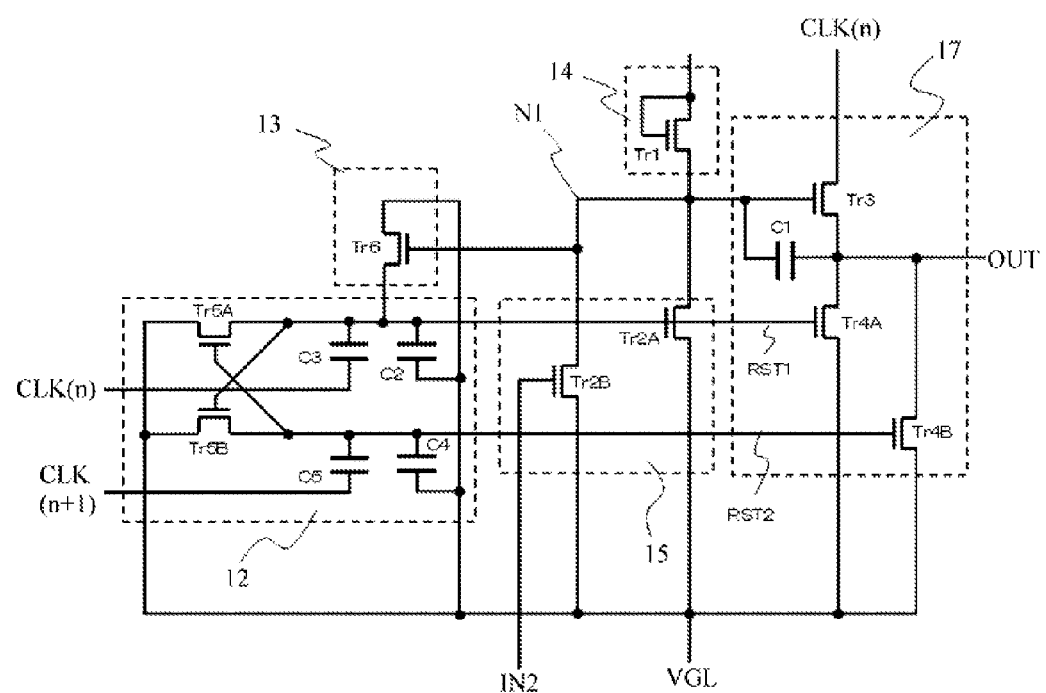
FIG. 7 is a circuit diagram depicting a structure of a unit circuit of the second embodiment of the invention.

FIG. 6 is a block diagram depicting a structure of a scanning circuit of the second embodiment, and FIG. 7 is a circuit diagram depicting a structure of a unit circuit of the second embodiment.

In FIG. 6, the scanning circuit 6 of the second embodiment is different from the first embodiment in that wiring for the reset voltage VR is unnecessary. Accordingly, the control signal line 11 includes the start signal ST, the final-stage control signal VO, and the clock signals CLK1 and CLK2.

In FIG. 7, the unit circuit 8 of the second embodiment includes a plurality of single conductivity type thin film transistors (Tr1 to Tr6), capacitors (C1 to C5), wires, and the terminals of input signals IN1 and IN2, clock signals CLK(n) and CLK(n+1), an output signal OUT, and the low level voltage VGL. In addition, the plurality of transistors Tr1, Tr2A to Tr2B, Tr3, Tr4A to Tr4B, Tr5A to Tr5B, and Tr6, and the capacitors C1 to C5, respectively, are connected as depicted in the drawing. In addition, the internal node N1 is connected to each of a gate terminal of the transistor Tr3, a source or drain terminal of the Tr1, a source or drain terminal of each of the Tr2A and Tr2B, and a gate terminal of the Tr6.

The Tr1, Tr2A, Tr2B, Tr3, Tr4A, and Tr6 are the same as those in the unit circuit 8 of the first embodiment. The Tr5A (Tr5B) has a gate controlled by the potential of the RST2 (RST1) to set the RST1 (RST2) to VGL. The Tr6 has a gate controlled by the potential of the node N1 to set RST1 (RST2) to VGL. One of the terminals of each of the C2 and the C3 is connected to the RST1 and the other terminal of each thereof is connected to VGL or CLK(n), thereby increasing the potential of the RST1 in response to a potential change of the CLK(n). One of the terminals of each of the C4 and the C5 is connected to the RST2 and the other terminal of each thereof is connected to VGL or CLK(n+1), thereby increasing the potential of the RST2 in response to a potential change of the CLK(n+1).

In the first embodiment, the Tr5A (Tr5B) increases the potential of the RST1 (RST2) to VR and the capacitors C2 and C3 (C5 and C6) are used to reduce the potential of the RST1 (RST2). On the other hand, in the second embodiment, the Tr5A(Tr5B) reduces the potential of the RST1 (RST2) to VGL and the C2 and the C3 (C5 and C6) are used to increase and reduce. In addition, when the Tr5A (Tr5B) of the second embodiment is turned ON, the Tr6 is not turned ON. Thus, no through-current occurs.

Herein, the circuit structure, connections of the respective transistors and the capacitors, and the like depicted in FIG. 7 are an example of preferable modes and the invention is not limited thereto. In addition, physical shapes and sizes of the respective transistors and the respective capacitors are preferably designed so as to achieve an operation margin sufficient for a circuit operation in the section "Description of Operation" that will be described later.

In addition, preferably, capacitance values of the C2 to C5 are 10 times or more greater than a sum of the gate capacitances of the Tr2A and Tr4A (Tr4B) and the gate to source (or drain) capacitances of the Tr5A (Tr5B) and the Tr6. Furthermore, when the capacitance values of the C2 to C5 are set to be 100 times or more greater than that, the RST1 or the RST2 can be controlled more precisely. Thus, since the scanning circuit that drives the display device in the second embodiment has the same effects as those in the first embodiment and is configured such that no through-current flows, it is expectable to obtain a display device with low power consumption.

Description of Operation

The operation of the second embodiment will be described with reference to FIGS. 7 and 8.

Figure 8:
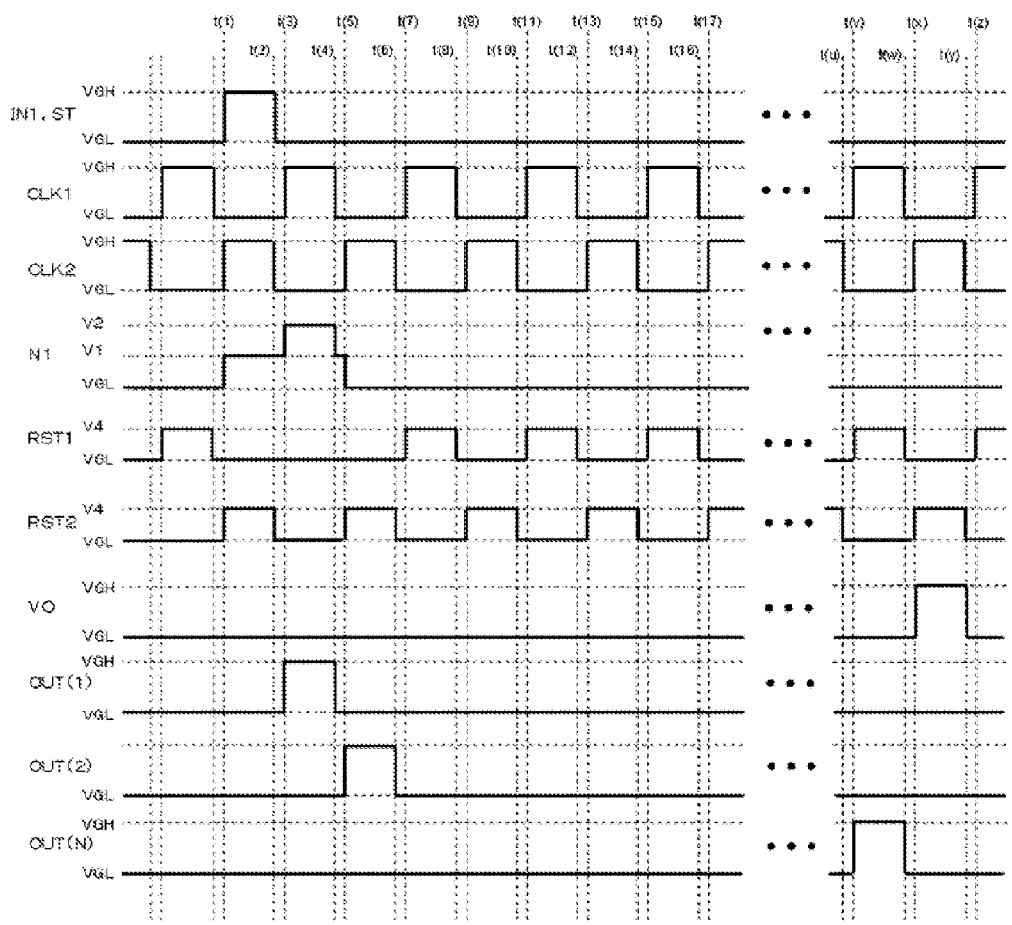
FIG. 8 is a timing chart illustrating an operation of the unit circuit of the second embodiment of the invention.

FIG. 8 is a timing chart depicting the operation of the unit circuit 8 of the second embodiment. The lateral axis represents time (t1) to (17), . . . t(u) to t(v)) and the vertical axis represents potentials of the respective signals, respectively. The input signal IN1 (ST to the first-stage unit circuit 8), the clock signals CLK1 to 2, the final-stage control signal VO, and the output signals OUT(1) to OUT(N) are signals with amplitudes from the high level voltage VGH to the low level voltage VGL. In addition, the reset signals RST1 to RST2 are signals with amplitudes from an arbitrary voltage V4 to VGL. Herein, the arbitrary voltage V4 is a voltage not less than VGL and not more than VGH.

A description will be given of an operation of the first-stage unit circuit 8 (UR(1)). In the UR(1), the CLK1 and the CLK2, respectively, are connected to the CLK(n) and the CLK(n+1), respectively, of FIG. 7.

In a time t(1), potentials of the ST and the CLK2 change from VGL to VGH. As a result, since the transistor Tr1 is turned ON, the potential of the node N1 changes from VGL to V1 (=VGH−Vth). Herein, the Vth is a threshold voltage of the Tr1. Due to the potential change of the node N1, the Tr3 is turned ON. In addition, the Tr5A is also turned ON and thus the RST1 is set to VGL. Accordingly, the Tr4A is turned OFF.

Next, in a time t(2), the potentials of the ST and the CLK2 change from VGH to VGL, thereby turning the Tr1 OFF. Since the RST2 is at VGL, the Tr2A and the Tr2B are OFF, the node N1 is brought into a floating state.

Next, in a time t(3), the CLK1 changes from VGL to VGH and therefore the signal passes through the Tr3 in the ON state, increasing the potential of the OUT(n). As a result, since the potential of the OUT as one of electrodes of the capacitor C1 has increased, the potential of the other electrode (the node N1) in the floating state furthermore increases from (VGH−Vth) to V2 due to a boot strap effect. Accordingly, since a large gate voltage not less than VGH is applied to the gate of the Tr3, the potential of the OUT changes to VGH without being attenuated. Since the RST1 and the RST2 are at VGL, all the Tr2A, Tr4A, and Tr4B are maintained to be OFF.

Next, in a time t(4), the CLK1 changes from VGH to VGL. At that time, since the Tr3 is ON, the OUT changes from VGH to VGL.

Next, in a time t(5), the CLK2 changes from VGL to VGH. Since the Tr5B is OFF at that time, the RST2 is in a floating state. In this state, since the CLK has changed from VGL to VGH, redistribution of electric charges stored in the C4 and the C5, whereby the potential of RST2 increases by V'. Herein, the value of the V' is the same as the voltage value represented by the formula (1) of the first embodiment. Due to this operation, the RST2 changes from VGL to V4 (=VGL+V'). Accordingly, since the Tr2B is turned ON, the node N1 changes to VGL and the Tr3 is turned OFF. In addition, the Tr4B is also turned ON to maintain the OUT(n) at VGL. In addition, an OUT of the subsequent stage UR(2) changes to VGH and thereby the IN2 of the UR(1) changes to VGH. As a result, the Tr2B is turned ON to set a node N1 to VGL, thereby turning the Tr3 OFF.

Next, in a time t(6), since the CLK2 changes from VGH to VGL, the RST2 is reduced by V' from V4 and thus set to VGL. Accordingly, the Tr5A is turned OFF.

Next, in a time t(7), since the CLK1 changes from VGL to VGH, redistribution of electric charges stored in the C2 and the C3 occurs, thereby increasing the potential of the RST1 by V'. Herein, the value of the v' is the same as the voltage value represented by the formula (2) of the first embodiment. Due to this operation, the RST1 changes from VGL to V4 (=VGL+V'). As a result, the Tr5B is turned ON and sets the RST2 to VGL. In addition, since the Tr2A and the Tr4A are turned ON, the node N1 and the OUT are maintained at VGL.

Next, in a time t(8), the CLK1 changes from VGH to VGL and thereby the RST1 is reduced by V' from V4 and set to VGL. As a result, the Tr2A and the Tr4A are turned OFF.

Next, in a time t(9), the CLK2 changes from VGL to VGH, whereby the RST2 changes to V4, as in the time t(7). As a result, the Tr4B is turned ON and maintains the OUT at VGL.

In a time t(10) and times thereafter, the operations during a period of the times of from t(5) to t(10) are repeated.

The main operation of the second-stage unit circuit 8 (UR(2)) is the same as that of the first-stage unit circuit 8 (UR(1)) except that the connection relationships of the CLK(n) and the CLK(n+1) are switched and the preceding-stage OUT signal is input to the IN1 in FIG. 7. The same also applies to operations of the third-stage unit circuit 8 (UR(3)) and thereafter. In times t(v) to t(w), the voltage of an output signal OUT(N) of a final-stage UR(N) becomes VGH, resulting in driving all the scanning lines 7.

Thus, the scanning circuit driving the display device in the second embodiment has the same effects as those in the first embodiment and has the structure in which no through-current flows, so that the display device can be expected to reduce power consumption.

Third Embodiment

Description of Structure

A structure of a scanning circuit according to a third embodiment of the present invention will be described with reference to the drawings.

In the third embodiment, the reset signal generation circuit 12 in the unit circuit including the single conductivity type thin film transistors in the first embodiment has a different structure. However, the structure of the display depicted in FIG. 1, the structure of the first substrate depicted in FIG. 2, and the structure of the scanning circuit depicted in FIG. 3A are also applied to the third embodiment.

Figure 9:
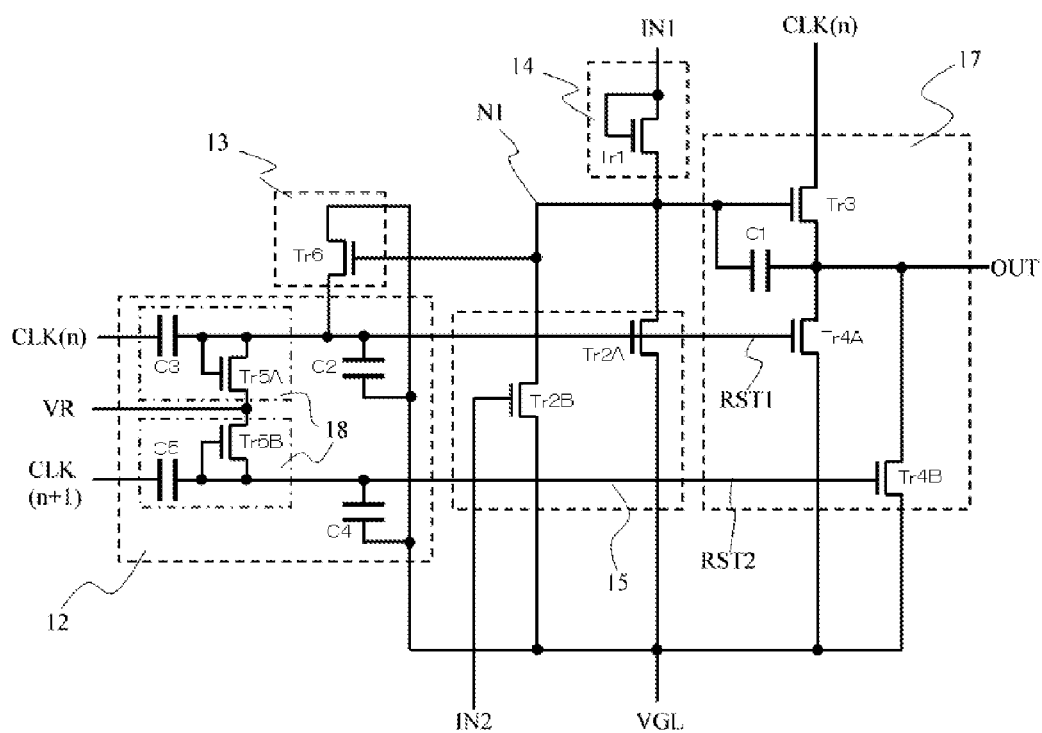
FIG. 9 is a circuit diagram depicting a structure of a unit circuit of a third embodiment of the invention.
Figure 10:
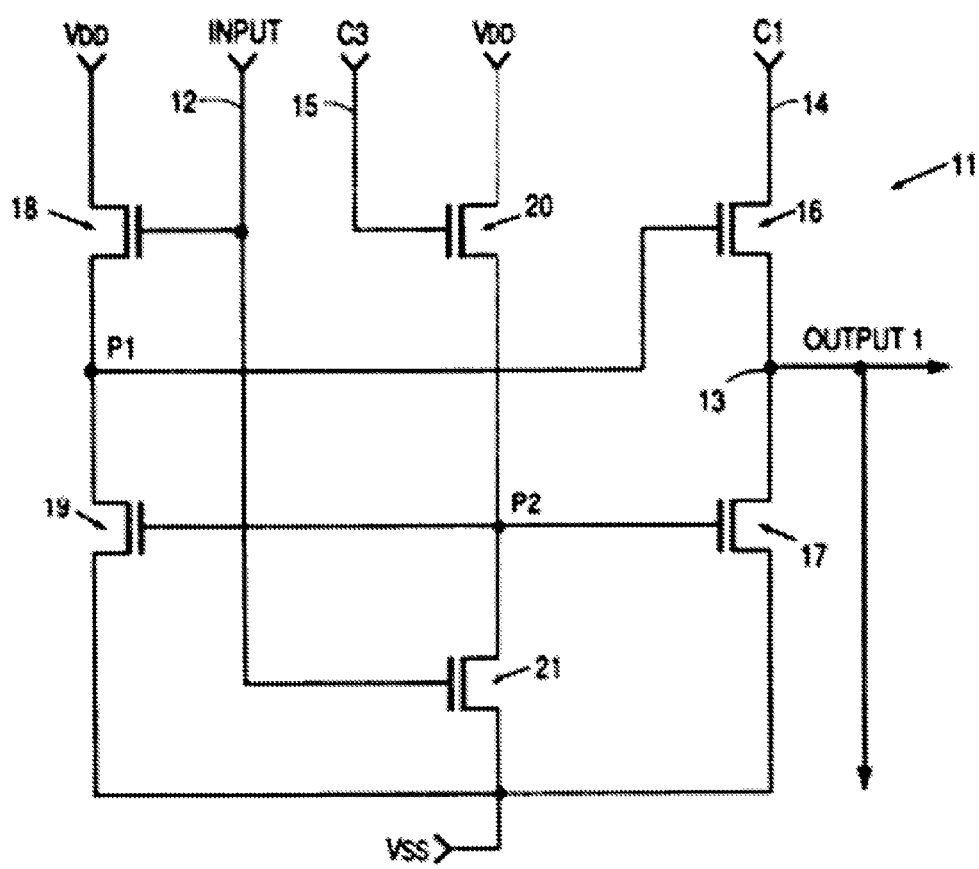
FIG. 10 is a circuit diagram depicting a structure of a first conventional unit circuit of the invention.
Figure 11:
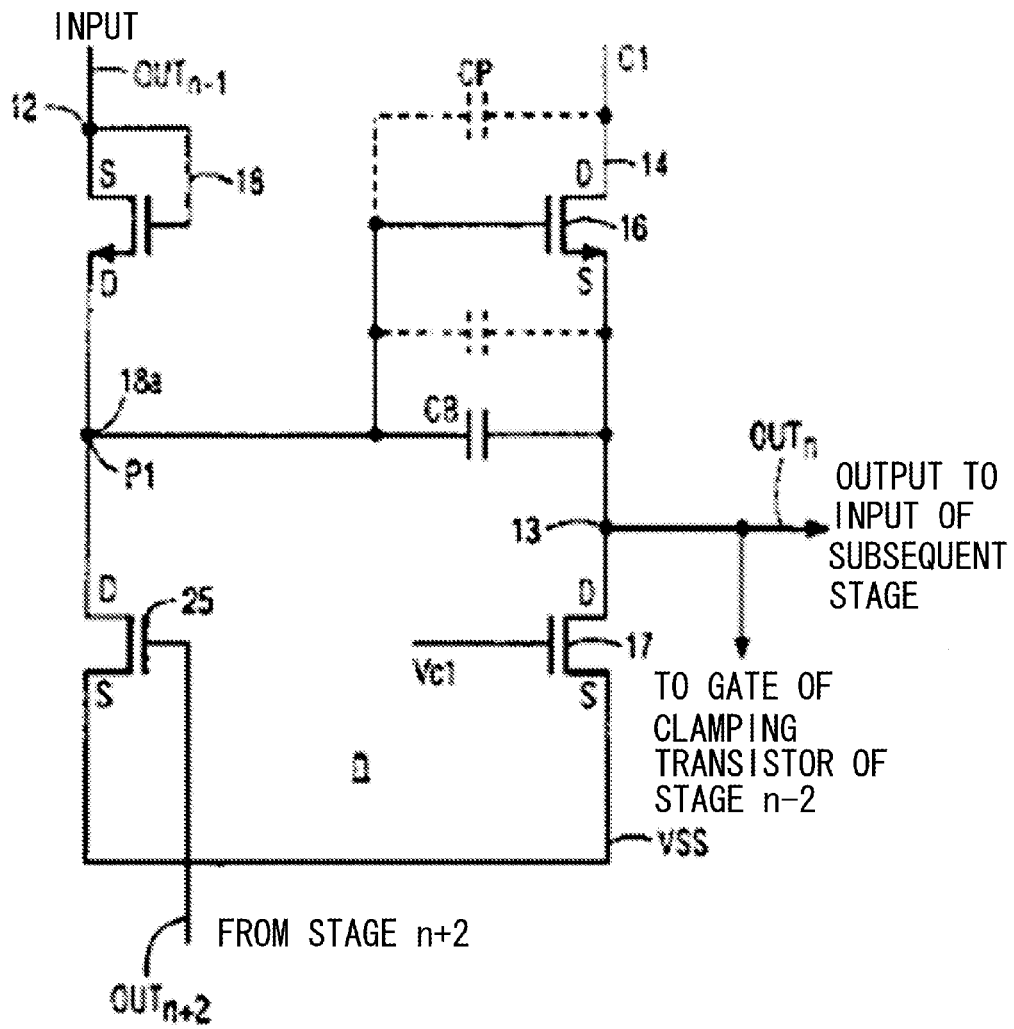
FIG. 11 is a circuit diagram depicting a structure of a second conventional unit circuit of the invention.
Figure 12:
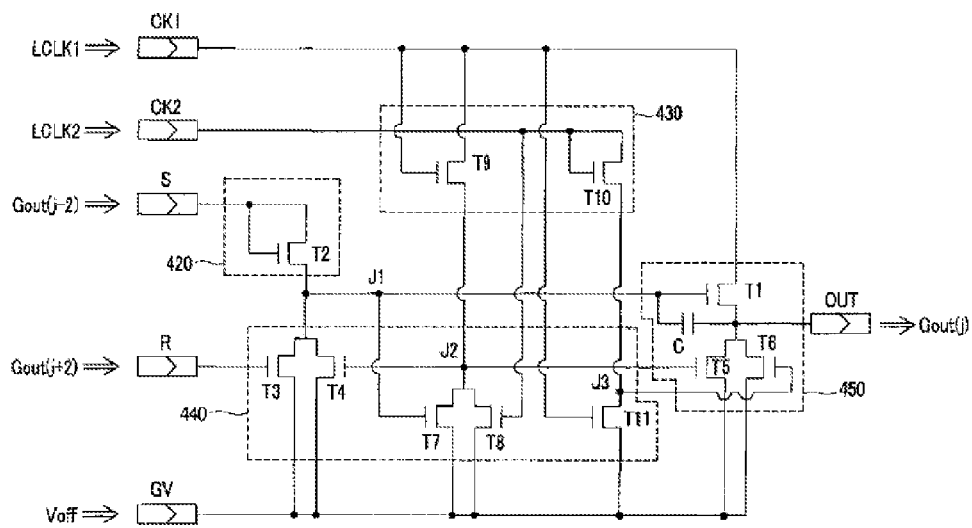
FIG. 12 is a circuit diagram depicting a structure of a third conventional unit circuit of the invention.
Figure 13:
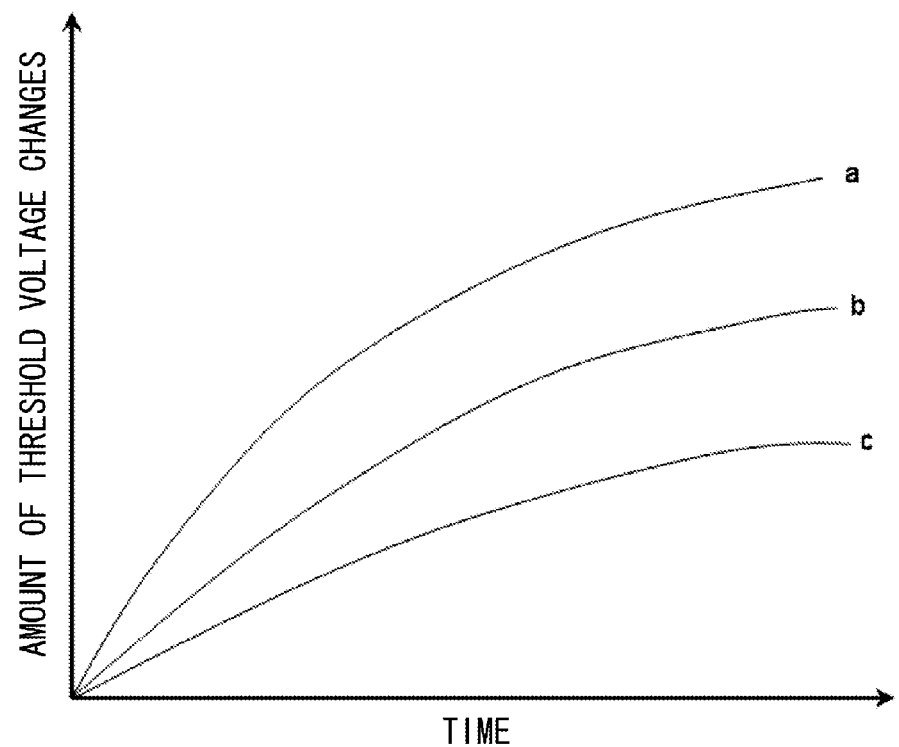
FIG. 13 is a graph depicting experiment results of the present invention.

FIG. 9 is a circuit diagram depicting a structure of a unit circuit according to the third embodiment.

In FIG. 9, the unit circuit 8 of the third embodiment includes the reset signal generation circuit 12 having a different structure from that of the first embodiment.

The reset signal generation circuit 12 of the third embodiment includes transistors Tr5A and Tr5B and capacitors C3 to C5, which are connected as depicted in FIG. 9.

The capacitor C3 (C5) and the transistor Tr5A (Tr5B) form a clamp circuit 18, and the transistor Tr5A (Tr5B) is diode-connected between the RST1 (RST2) and a reset power supply VR. The C2 (C4) is connected to the RST1 (RST2) and the low level power supply VGL, and the C3 (C5) is connected to the clock signal CLK(n) (CLK(n+1)) and RST1 (RST2).

With the above structure, in the potential change of the RST1 (RST2) due to the potential change of the CLK(n) (CLK(n+1)) via the C3 (C5), when the potential of the CLK(n) (CLK(n+1)) changes from the low level power supply to the high level power supply, the potential change of the RST1 (RST2) does not reach the high level power supply and is limited to the reset power supply VR (the detail will be described later in the section "Description of Operation"). As a result, the high level voltage of the RST1 (RST2) is set to VR, as in the first and the second embodiments.

Herein, the circuit structure, connections of the respective transistors and the capacitors, and the like depicted in FIG. 9 are an example of preferable modes and the invention is not limited thereto. In addition, physical shapes and sizes of the respective transistors and the respective capacitors are preferably designed so as to achieve an operation margin sufficient for a circuit operation in the section "Description of Operation" that will be described later.

In addition, preferably, capacitance values of the C2 to C5 are 10 times or more greater than a sum of the gate capacitances of the Tr2A and Tr4A (Tr4B) and the gate to source (or drain) capacitances of the Tr5A (Tr5B) and the Tr6. Furthermore, when the capacitance values thereof are 100 times or more greater than that, the RST1 or the RST2 can be controlled more precisely depending on the setting of the capacitance values of the C2 to C5. Thus, the scanning circuit driving a display device disclosed in the third embodiment has the different structure but exhibits the same effect as the first embodiment.

Description of Operation

Since the third embodiment is different from the first embodiment in terms of the structure of the reset signal generation circuit 12, a description will be given of an operation of the reset signal generation circuit 12 of the third embodiment with reference to FIG. 5A.

In a time t(1), the CLK2 changes from VGL to VGH, whereby the potential of the RST2 increases from V3 via the C5. At that time, when the potential of the RST2 goes up to VR, the transistor TR5B is turned ON and maintains the RST2 at VR.

Next, in a time t(2), when the CLK2 changes from VGH to VGL, the redistribution of electric charges stored in the C4 and C5 occurs, thereby reducing the potential of the RST2 by V'. Herein, the value of the V' is the same as the voltage value represented by the formula (1) of the first embodiment. Due to this operation, the RST2 changes from VR to V3 (=VR–V').

Next, in a time t(3), the CLK1 changes from VGL to VGH, whereby there occurs a force increasing the potential of the RST1 via the C3. However, at that time, the potential of the node N1 increases from V1 to V2 and therefore the transistor Tr6 is ON. In other words, since the RST1 is at VGL, the RST1 is set to VGL regardless of the increased potential of the CLK1. At that time, since no DC current flows through the RST1, the cancellation of reset operation does not consume any extra current.

This state continues until a time t(7). In the time t(7), when the CLK1 changes from VGL to VGH, the potential of the RST1 increases via the C3. At that time, when the RST1 goes up to VR, the transistor Tr5A is turned ON and maintains the RST1 at VR.

Next, in a time t(8), when the CLK2 changes from VGH to VGL, the redistribution of electric charges stored in the C2 and the C3 occurs, thereby reducing the potential of the RST1 by V'. Herein, the value of the V' is the same as the voltage value represented by the formula (1) of the first embodiment. Due to this operation, the RST1 changes from VR to V3 (=VR–V').

Thus, the scanning circuit driving a display device in the third embodiment is configured such that no through-current flows but has the same effect as the first embodiment, so that there can be obtained a display device that reduces power consumption.

Fourth Embodiment

Description of Structure

A structure of a scanning circuit according to a fourth embodiment of the present invention will be described with reference to the drawings.

In the fourth embodiment, the reset signal generation circuit 12 in the unit circuit including the single conductivity type thin film transistors in the first embodiment has a different structure. However, the structure of the display depicted in FIG. 1, the structure of the first substrate depicted in FIG. 2, and the structure of the scanning circuit depicted in FIG. 3A are also applied to the fourth embodiment.

Figure 14:
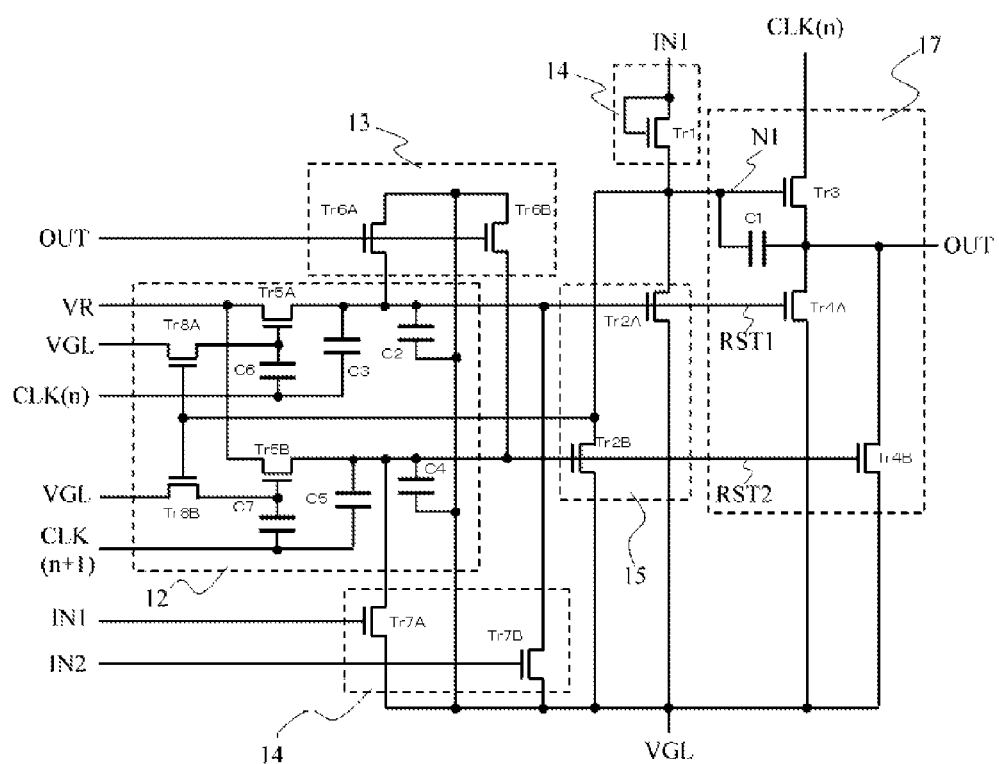
FIG. 14 is a circuit diagram depicting a structure of a unit circuit of a fourth embodiment of the invention.

FIG. 14 is a circuit diagram depicting a structure of a unit circuit of the fourth embodiment.

In FIG. 14, the reset signal generation circuit 12 in a unit circuit 8 of the fourth embodiment has a different structure from that in the first embodiment.

The reset signal generation circuit 12 of the fourth embodiment includes Tr5A, Tr5B, Tr8A, Tr8B, and capacitors C2 to C7, which are connected as depicted in FIG. 14.

A source terminal or a drain terminal of the transistor Tr5A (Tr5B) is connected between the RST1 (RST2) and the reset power supply VR, and a gate thereof is connected to an electrode of C6 (C7) and a drain terminal or a source terminal of Tr8A (Tr8B). The gates of the transistors Tr8A (Tr8B) are both connected to the node N1 and source terminals or drain terminals thereof are connected to VGL or the respective gates of the Tr5A (Tr5B).

The capacitor C2 (C4) is connected to the RST1 (RST2) and the low level power supply VGL, and the capacitor C3 (C5) is connected to the clock signal CLK(n) (CLK(n+1)) and RST1 (RST2). One of electrodes of the capacitance C6 (C7) is connected to the gate of the Tr5A (Tr5B) and a drain or source electrode of the Tr8A (Tr8B), whereas the other electrode thereof is connected to CLK(n) (CLK(n+1)).

With the above structure, in the potential change of the RST1 (RST2) due to the potential change of the CLK(n) (CLK(n+1)) via the C3 (C5), when the potential of the CLK(n) (CLK(n+1)) changes from the low level power supply to the high level power supply, the potential change of the RST1 (RST2) does not reach the high level power supply and is limited to the reset power supply VR (the detail will be described later in the section "Description of Operation"). As a result, the high level voltage of the RST1 (RST2) is set to VR, as in the first and the second embodiments.

Herein, the circuit structure, connections of the respective transistors and the capacitors, and the like depicted in FIG.

14 are an example of preferable modes and the invention is not limited thereto. In addition, physical shapes and sizes of the respective transistors and the respective capacitors are preferably designed so as to achieve an operation margin sufficient for a circuit operation in the section "Description of Operation" that will be described later.

In addition, preferably, capacitance values of the C2 to C7 are 10 times or more greater than a sum of the gate capacitances of the Tr2A, Tr4A (Tr4B), and Tr5A (Tr5B) or the gate to source (or drain) capacitances of the Tr6A (Tr6B). Furthermore, when the capacitance values of the C2 to C7 are set to be 100 times or more greater than that, the RST1 or the RST2 can be controlled more precisely.

Thus, the scanning circuit driving the display device disclosed in the fourth embodiment has the different structure but exhibits the same effect as the first embodiment.

Description of Operation

The fourth embodiment is different from the first embodiment in terms of the structure of the reset signal generation circuit 12. Accordingly, a description will be given of an operation of the reset signal generation circuit 12 of the fourth embodiment with reference to FIG. 5A.

In a time t(1), when the CLK2 changes from VGL to VGH, the Tr5B is turned ON via the C7, whereby the potential of the RST2 is increased from V3 and set to VR. Next, in a time t(2), when the CLK2 changes from VGH to VGL, the redistribution of electric charges stored in the C4 and the C5 occurs, thereby reducing the potential of the RST2 by V'. Herein, the value of the V' is the same as the voltage value represented by the formula (1) of the first embodiment. Due to this operation, the RST2 changes from VR to V3 (=VR−V').

Next, in a time t(3), the CLK1 changes from VGL to VGH. However, since the potential of the node N1 is V2, the Tr8A is turned ON, whereas the Tr5A is OFF since the gate of the Tr5A is set to VGL. In addition, although a force increasing the potential of the RST1 acts via the C3, the node N1 at that time is at V2 and therefore the transistor Tr6 is ON. In other words, since the RST1 is set to VGL, the RST1 will be set to VGL regardless of the potential increase of the CLK1. In this case, there is no DC current passing through the RST1. Thus, the cancellation of the reset operation does not consume any extra current.

This state continues until a time t(7). In the time t(7), when the CLK1 changes from VGL to VGH, the transistor Tr5A is turned ON and thus the RST1 is set to VR.

Next, in a time t(8), when the CLK2 changes from VGH to VGL, the redistribution of electric charges stored in the C2 and the C3 occurs, thereby reducing the potential of the RST1 by V'. Herein, the value of the V' is the same as the voltage value represented by the formula (1) of the first embodiment. Due to this operation, the RST1 changes from VR to V3 (=VR−V').

Thus, the scanning circuit driving a display device in the fourth embodiment is configured such that no through-current flows but exhibits the same effect as the first embodiment, so that there can be obtained a display device that reduces power consumption.

Examples of use of the present invention include display devices.

What is claimed is:

1. A scanning circuit comprising a plurality of unit circuits, each of which comprises a plurality of single conductivity type thin-film transistors and is controlled in synchronization with a plurality of clock signals, wherein each of the unit circuits comprises at least an output circuit, a reset circuit, and a reset signal generation circuit;

the output circuit comprises a circuit element for transferring one of the clock signals to an output terminal and a circuit element for maintaining the output terminal at a constant voltage;

the reset circuit has a function of stopping the circuit element for transferring the clock signal to the output terminal;

the reset signal generation circuit generates a plurality of reset signals, the reset signals controlling the reset circuit and the circuit element for maintaining the output terminal at a constant voltage; and an amplitude of the reset signals is smaller than an amplitude of the clock signals.

2. The scanning circuit according to claim 1, wherein each of the unit circuits further comprises a reset cancellation circuit that has a function of stopping both the reset circuit and the circuit element for maintaining the output terminal at a constant voltage.

3. The scanning circuit according to claim 1, wherein a potential change from a low level voltage to a high level voltage in the reset signals is performed by controlling the transistors in the reset signal generation circuit by the clock signals to turn ON;

a potential change from the high level voltage to the low level voltage in the reset signals is performed by a plurality of capacitors in the reset signal generation circuit in accordance with a potential change from a high level voltage to a low level voltage in each of the clock signals.

4. The scanning circuit according to claim 1, wherein the amplitude of each of the reset signals is determined by the amplitude of each of the clock signals, a capacitor A electrically connected to a terminal of the clock signal, and a capacitor B electrically connected to a terminal other than the clock signal.

5. The scanning circuit according to claim 4, wherein when the amplitude of the clock signal is V, a capacitance value of the capacitor A is Ca, and a capacitance value of the capacitor B is Cb, the amplitude of the reset signal is determined by the following formula:

$$Ca/(Ca+Cb) \times V \tag{1}$$

6. The scanning circuit according to claim 1, wherein the clock signals and the reset signals, respectively, are of N phases (N is a natural number not less than 2).

7. The scanning circuit according to claim 1, wherein the clock signals are of N phases (N is a natural number not less than 2); and the reset signal generation circuit comprises at least N pieces of circuit elements, the N pieces of the circuit elements being controlled in synchronization with clock signals having mutually different phases.

8. The scanning circuit according to claim 4, wherein the clock signals are of N phases (N is a natural number not less than 2); and the reset signal generation circuit comprises N pieces of circuit elements, the N pieces of the circuit elements comprising at least a switch that are controlled by the clock signals and the capacitors A and B.

9. The scanning circuit according to claim 8, wherein when the amplitude of each of the clock signals is V, the capacitance value of the capacitor A is Ca, and the capacitance value of the capacitor B is Cb, the high level voltage of each of the reset signals is determined by the switch and the low level voltage of the reset signal is determined by reducing by an amount of a voltage substantially determined by the following formula (2):

$$Ca/(Ca+Cb) \times V \qquad (2)$$

from the high level voltage of the reset signal due to the change of the clock signal from the high level voltage to the low level voltage.

10. The scanning circuit according to claim 4, wherein the clock signals are of N phases (N is a natural number not less than 2); and the reset signal generation circuit comprises N pieces of circuit elements, the N pieces of the circuit elements comprising at least a clamp circuit for limiting the high level voltage of the reset signals to a voltage not more than the high level voltage of the clock signals and the capacitors A and B.

11. The scanning circuit according to claim 10, wherein when the amplitude of each of the clock signals is V, the capacitance value of the capacitor A is Ca, and the capacitance value of the capacitor B is Cb, the high level voltage of each of the reset signals is determined by the clamp circuit and the low level voltage of the reset signal is determined by reducing by an amount of a voltage substantially determined by the following formula (3):

$$Ca/(Ca+Cb) \times V \qquad (3)$$

from the high level voltage of the reset signal due to the change of the clock signal from the high level voltage to the low level voltage.

12. The scanning circuit according to claim 1, wherein the output circuit is electrically connected to one of the clock signals, a first node, and an output signal which is the output of the output circuit;

the reset circuit is electrically connected to a low level power supply whose supply potential is low level potential of the output signal, the reset signals, the first node, and the output signal of an adjacent unit circuit or a control signal supplied from outside; and the reset signal generation circuit is electrically connected to the low level power supply, a reset power supply which generates the potential of the reset signal, the clock signals, and the reset signals.

13. The scanning circuit according to claim 2, wherein:
the output circuit is electrically connected to one of the clock signals, a first node, and an output signal which is the output of the output circuit;

the reset circuit is electrically connected to a low level power supply whose supply potential is low level potential of the output signal, the reset signals, the first node, and the output signal of an adjacent unit circuit or a control signal supplied from outside;

the reset signal generation circuit is electrically connected to the low level power supply, a reset power supply which generates the potential of the reset signal, the clock signals, and the reset signals; and the reset cancellation circuit is electrically connected to the low level power supply, the first node, and one of the reset signals that has the same phase as the clock signal connected to the output circuit.

14. The scanning circuit according to claim 1, wherein the clock signals are of N phases (N is a natural number not less than 2);

the output circuit comprises a transfer transistor for transferring one of the clock signals, a first capacitor, and N pieces of reset transistors;

the reset circuit comprises at least two transistors; and the reset signal generation circuit comprises at least N pieces of circuit elements, each of which comprises at least one transistor, a second capacitor, and a third capacitor.

15. The scanning circuit according to claim 14, wherein a gate, a drain, and a source, respectively, of the transfer transistor are electrically connected to a first node, the one of the clock signals, and an output signal, respectively, the first capacitor is electrically connected to the first node and the output signal, and respective gates, all sources, and all drains, respectively, of the reset transistors are electrically connected to any one of the reset signals, a low level power supply, and the output signal, respectively;

a gate, a source, and a drain, respectively, of one of the two transistors of the reset circuit are electrically connected to one of the reset signals that has the same phase as the clock signal electrically connected to the drain of the transfer transistor of the output circuit, the low level power supply, and the first node, respectively; and a gate, a source, and a drain, respectively, of the transistor of each of the circuit elements of the reset signal generation circuit are electrically connected to one of the clock signals, one of the reset signals, and a reset power supply, respectively; the second capacitor is electrically connected to one of the clock signals and one of the reset signals, and the third capacitor is electrically connected to the low level power supply or another electric wire and one of the reset signals.

16. The scanning circuit according to claim 14, wherein a gate, a drain, and a source, respectively, of the transfer transistor are electrically connected to a first node, the one of the clock signals, and an output signal, respectively, the first capacitor is electrically connected to the first node and the output signal, and respective gates, all sources, and all drains, respectively, of the reset transistors are electrically connected to any one of the reset signals, a low level power supply, and the output signal, respectively;

a gate, a source, and a drain, respectively, of one of the two transistors of the reset circuit are electrically connected to one of the reset signals that has the same phase as the clock signal electrically connected to the drain of the transfer transistor of the output circuit, the low level power supply, and the first node, respectively; and a source, a drain, and a gate, respectively, of the transistor of each of the circuit elements of the reset signal generation circuit are electrically connected to the low level power supply, one of the reset signals, and the other one of the reset signals that is different from the reset signal connected to the drain, respectively, the second capacitor is electrically connected to one of the clock signals and the one of the reset signals, and the third capacitor is electrically connected to the low level power supply or another electric wire and the one of the reset signals.

17. The scanning circuit according to claim 14, wherein a gate, a drain, and a source, respectively, of the transfer transistor are electrically connected to a first node, the one of the clock signals, and an output signal, respectively, the first capacitor is electrically connected to the first node and the output signal, and respective gates, all sources, and all drains, respectively, of the reset transistors are electrically connected to any one of the reset signals, a low level power supply, and the output signal, respectively;

a gate, a source, and a drain, respectively, of one of the two transistors of the reset circuit are electrically connected to one of the reset signals that has the same phase as the clock signal electrically connected to the drain of the transfer transistor of the output circuit, the low level power supply, and the first node, respectively; and a gate and a source of the transistor of each of the circuit elements of the reset signal generation circuit are electrically connected to one of the reset signals and a drain of the transistor of each thereof is electrically connected to a reset power supply, the second capacitor is electrically connected to one of the clock signals and the one of the reset signals, and the third capacitor is electrically connected to the low level power supply or another electric wire and the one of the reset signals.

18. The scanning circuit according to claim 1, wherein the low level voltage of the reset signals is lower than the low level voltage of the clock signals.

19. The scanning circuit according to claim 1, wherein a first electrode of a capacitor C is connected to a gate of the transistor for determining the high level voltage of one of the reset signals and a second electrode of the capacitance C is connected to one of the clock signals.

20. A display device comprising the scanning circuit according to claim 1.

21. A scanning circuit comprising a plurality of unit circuits, each of which comprises a plurality of signal conductivity type thin-film transistors and is controlled in synchronization with a plurality of clock signals, wherein each of the unit circuits comprises at least an output circuit, a reset circuit, and a reset signal generation circuit;

the output circuit comprises a circuit element for transferring one of the clock signals to an output terminal and a circuit element for maintaining the output terminal at a constant voltage;

the reset circuit has a function of stopping the circuit element for transferring the clock signal to the output terminal;

the reset signal generation circuit generates a plurality of reset signals, the reset signals controlling the reset circuit and the circuit element for maintaining the output terminal at a constant voltage;

all of the reset signals output from the reset signal generation circuit are signals for controlling the reset circuit in the unit circuit including the reset signal generation circuit that generates the reset signals, and for controlling the circuit element for maintaining the output terminal at a constant voltage;

one of the reset signals has a same phase as the clock signal input to the output circuit, and an amplitude of the reset signals is smaller than an amplitude of the clock signals.

* * * * *